(12) United States Patent
Albers et al.

(10) Patent No.: US 9,368,461 B2
(45) Date of Patent: Jun. 14, 2016

(54) CONTACT PADS FOR INTEGRATED CIRCUIT PACKAGES

(71) Applicant: INTEL CORPORATION, Santa Clara, CA (US)

(72) Inventors: Sven Albers, Regensburg (DE); Georg Seidemann, Landshut (DE); Sonja Koller, Regensburg (DE); Stephan Stoeckl, Schwandorf (DE); Shubhada H. Sahasrabudhe, Gilbert, AZ (US); Sandeep B. Sane, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/280,110

(22) Filed: May 16, 2014

(65) Prior Publication Data

US 2015/0333022 A1 Nov. 19, 2015

(51) Int. Cl.
*H01L 23/00* (2006.01)
*H01L 23/498* (2006.01)

(52) U.S. Cl.
CPC .......... *H01L 24/05* (2013.01); *H01L 23/49811* (2013.01); *H01L 24/03* (2013.01); *H01L 24/16* (2013.01); *H01L 24/17* (2013.01); *H01L 24/81* (2013.01); *H01L 2224/0401* (2013.01); *H01L 2224/141* (2013.01)

(58) Field of Classification Search
CPC .................. H01L 23/49513; H01L 23/485
See application file for complete search history.

(56) References Cited

U.S. PATENT DOCUMENTS

| | | | | |
|---|---|---|---|---|
| 5,326,428 A * | 7/1994 | Farnworth et al. | ............ | 324/724 |
| 5,578,526 A * | 11/1996 | Akram et al. | ................ | 438/107 |
| 5,726,501 A * | 3/1998 | Matsubara | ..................... | 257/778 |
| 6,037,786 A * | 3/2000 | Palagonia | ............ | G01R 1/0466 |
| | | | | 324/754.18 |
| 6,336,269 B1 * | 1/2002 | Eldridge et al. | ................ | 29/885 |
| 6,384,343 B1 * | 5/2002 | Furusawa | ..................... | 174/260 |
| 6,613,332 B1 * | 9/2003 | Michael et al. | ............ | 424/184.1 |
| 7,391,117 B2 * | 6/2008 | Kirby et al. | .................... | 257/773 |
| 7,728,431 B2 * | 6/2010 | Harada et al. | ................ | 257/750 |
| 8,456,022 B2 * | 6/2013 | Hammedinger et al. | ..... | 257/779 |
| 8,637,986 B2 * | 1/2014 | Masuda et al. | ................ | 257/739 |
| 2002/0092672 A1 * | 7/2002 | Primavera | ..................... | 174/250 |
| 2003/0052156 A1 * | 3/2003 | Kim et al. | ................ | 228/180.22 |
| 2006/0049519 A1 | 3/2006 | Otsuki | | |
| 2009/0242258 A1 | 10/2009 | So et al. | | |
| 2010/0044884 A1 | 2/2010 | Zbrzezny et al. | | |
| 2013/0180772 A1 | 7/2013 | Inoue et al. | | |
| 2013/0277838 A1 * | 10/2013 | Yu et al. | ....................... | 257/738 |

OTHER PUBLICATIONS

Notice of Preliminary Rejection mailed Mar. 15, 2016, issued in corresponding Korean Patent Application No. 2015-0053120, 9 pages.
Notice of Reasons for Rejection mailed Apr. 19, 2016, for Japanese Patent Application No. 2015-075560, 5 pages.

* cited by examiner

*Primary Examiner* — William Coleman
(74) *Attorney, Agent, or Firm* — Schwabe, Williamson & Wyatt, P.C.

(57) ABSTRACT

Disclosed herein are contact pads for use with integrated circuit (IC) packages. In some embodiments, a contact pad disclosed herein may be disposed on a substrate of an IC package, and may include a metal projection portion and a metal recess portion. Each of the metal projection portion and the metal recess portion may have a solder contact surface. The solder contact surface of the metal recess portion may be spaced away from the solder contact surface of the metal projection portion. Related devices and techniques are also disclosed herein, and other embodiments may be claimed.

23 Claims, 19 Drawing Sheets

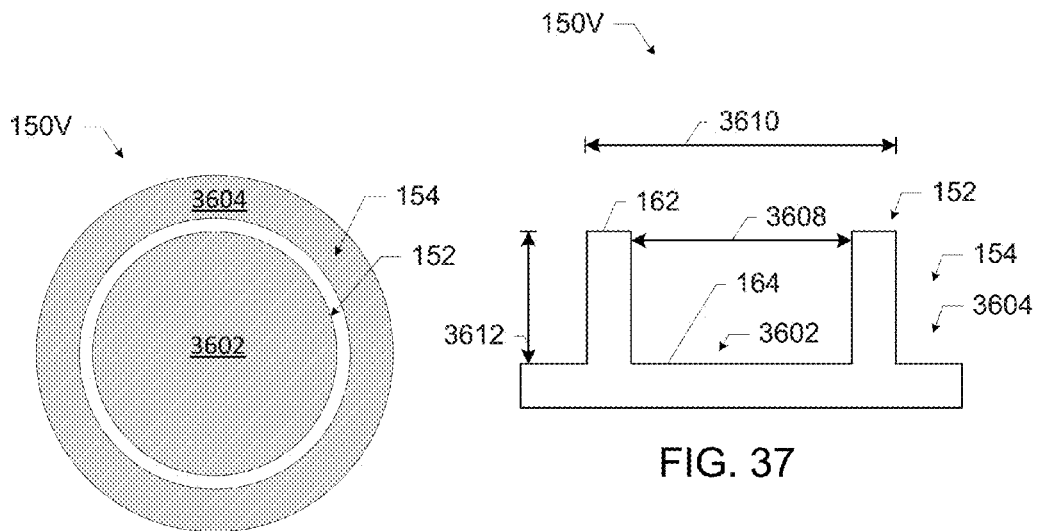
FIG. 36
FIG. 37
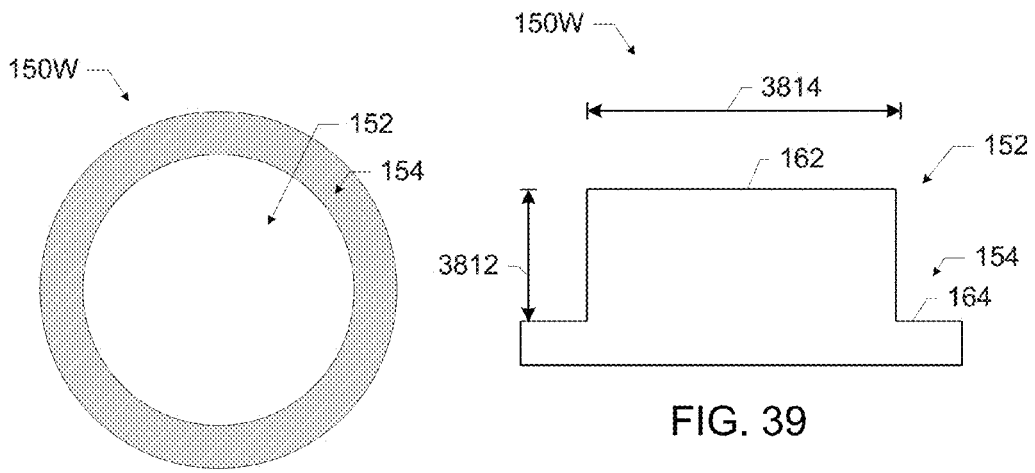
FIG. 38
FIG. 39

CONTACT PADS FOR INTEGRATED CIRCUIT PACKAGES

TECHNICAL FIELD

The present disclosure relates generally to the field of integrated circuits (ICs), and more particularly, to contact pads for IC packages.

BACKGROUND

In existing integrated circuit (IC) devices, substantially flat, round contact pads are used on IC packages to form solder joints with corresponding contact pads on circuit boards. The coupling achieved between the IC packages may be insufficiently reliable in the face of warpage and solder fatigue due to thermo-mechanical conditions.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the Figures of the accompanying drawings.

FIGS. 22-39 are various views of additional embodiments of contact pads having metal projection portions and metal recess portions, in accordance with various embodiments.

DETAILED DESCRIPTION

Disclosed herein are contact pads for use with integrated circuit (IC) packages. In some embodiments, the contact pad disclosed herein may be disposed on a substrate of an IC package, and may include a metal projection portion and a metal recess portion. Each of the metal projection portion and the metal recess portion may have a solder contact surface. The solder contact surface of the metal recess portion may be spaced away from the solder contact surface of the metal projection portion. Related devices and techniques are also disclosed herein.

Various embodiments of the contact pads disclosed herein may provide improved thermo-mechanical performance to electronic devices in which the contact pads are included. In particular, various embodiments of the contact pads disclosed herein may reduce the risk of solder bridging in surface mount devices and/or increase the number of thermal cycles that the electronic device can undergo before mechanical failure, relative to conventional contact pads.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment," or "in embodiments," which may each refer to one or more of the same or different embodiments. Furthermore, the terms "comprising," "including," "having," and the like, as used with respect to embodiments of the present disclosure, are synonymous. As used herein, the term "magnet" may include permanent magnets and electromagnets.

Figure 1:
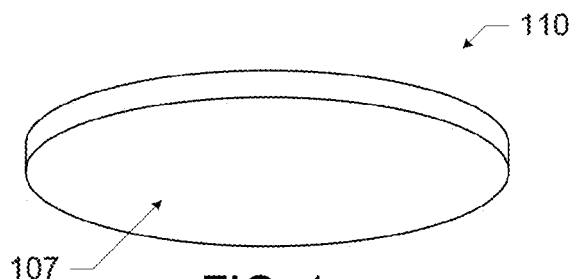
FIGS. 1 and 2 illustrate an example conventional contact pad that may be used on a substrate of an integrated circuit (IC) package.
Figure 2:
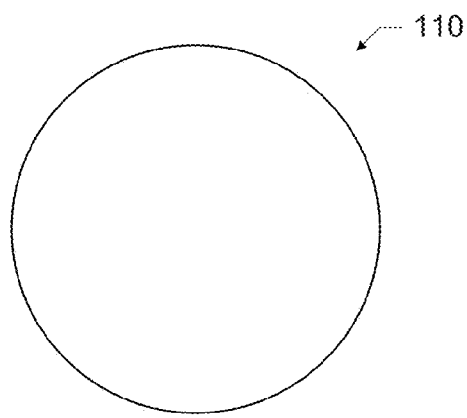

FIGS. 1 and 2 illustrate an example conventional contact pad 110 that may be used on a substrate of an IC package. In particular, FIG. 1 is a perspective view of the conventional contact pad 110, and FIG. 2 is a top view of the conventional contact pad 110. As shown, the conventional contact pad 110 typically has a circular footprint and a substantially uniform solder contact surface 107. As used herein, a "substantially uniform" surface may refer to a surface that is substantially planar. As used herein, a "solder contact surface" may be a surface of a contact pad to which solder is expected to adhere when the contact pad is used to form an electrical coupling with another component.

Figure 3:
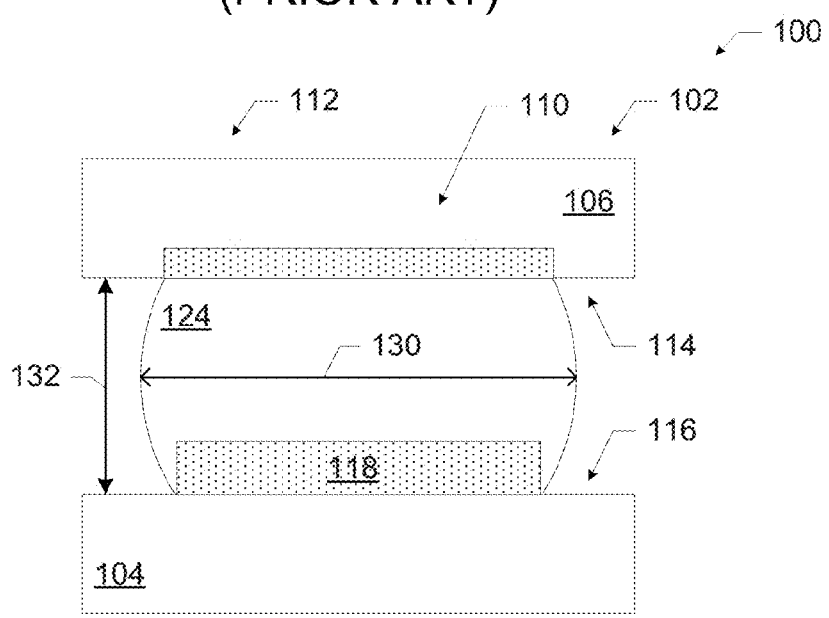
FIG. 3 is a side view of a portion of an electronic device in which a conventional contact pad is disposed on a surface of a substrate of an IC package.

FIG. 3 is a side view of a portion of an electronic device 100 in which the conventional contact pad 110 is disposed on a surface 114 of a substrate 106 of an IC package 102, and a solder joint 124 electrically and mechanically couples the conventional contact pad 110 with a contact pad 118 disposed on a circuit board 104. The surface of the conventional contact pad 110 to which the solder joint 124 is coupled may extend above, be flush with, or be recessed below the surface 114 of the substrate 106. In some embodiments, a portion of solder stop resist (not shown) may be disposed on the surface 114 and may extend onto the conventional contact pad 110, thus reducing the size of the contact area between the solder joint 124 and the conventional contact pad 110 from the nominal dimensions of the conventional contact pad 110.

The substrate 106 may have a surface 112 opposite to the surface 114. A die, package material (e.g., mold compound) or other electronic component (not shown) may be disposed on the surface 112. The surface 114 of the substrate 106 may be spaced away from a surface 116 of the circuit board 104 by a spacing 132. The solder joint 124 may have a width 130. In general, the IC package 102 may include multiple conventional contact pads 110, each of which may be soldered to a corresponding contact pad 118 on the circuit board 104 to enable the flow of electrical signals between circuitry included in or coupled with the IC package 102 and circuitry coupled to the circuit board 104.

Figure 4:
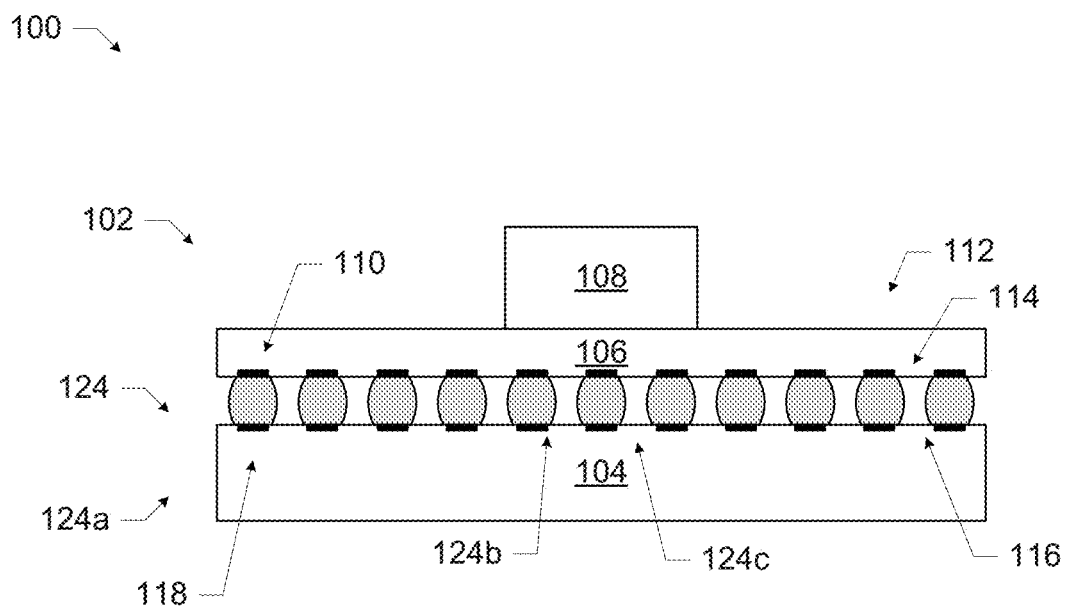
FIGS. 4 and 5 illustrate a scenario in which deformation of an IC package, and/or a circuit board to which the IC package is coupled, may cause solder bridging.
Figure 5:
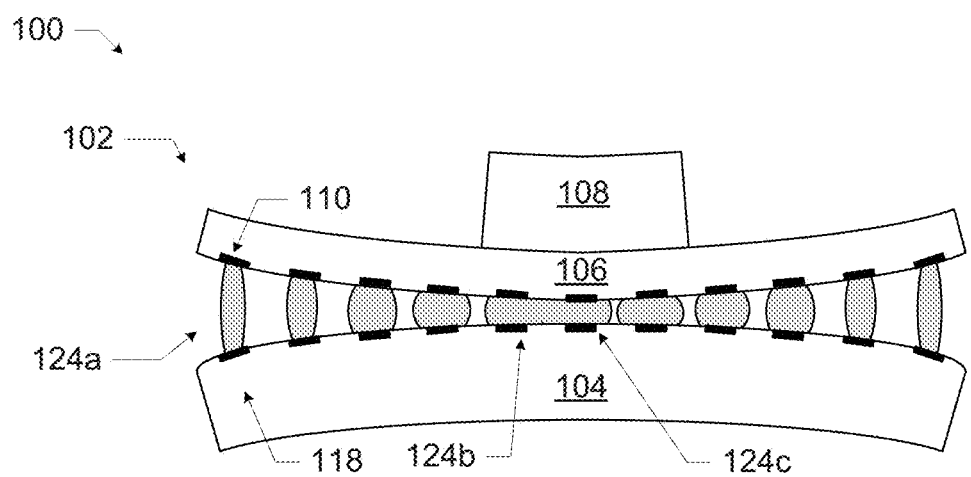

FIGS. 4 and 5 illustrate a scenario in which deformation of an IC package, and/or a circuit board to which the IC package is coupled, may cause solder bridging. In particular, FIG. 4 illustrates an electronic device 100 that is not generating significant heat or is otherwise operating in stable ambient temperature environment such that the components of the electronic device 100 are not significantly thermally stressed. As discussed above with reference to FIGS. 1-3, the electronic device 100 may include an IC package 102 coupled to a circuit board 104. The IC package 102 may include a substrate 106 and one or more contact pads 110 disposed on a surface 114 of the substrate 106. The circuit board 104 may include one or more contact pads 118 disposed on a surface 116 of the circuit board 104. The IC package 102 may be electrically and mechanically coupled with the circuit board 104 via one or more solder joints 124 between respective ones of the conventional contact pads 110 and the contact pads 118. Individual solder joints 124a, 124b, and 124c are labeled.

The IC package 102 may include a die 108 coupled to a surface 112 of the substrate 106. As shown, the surface 112 may be opposite to the surface 114. The die may include silicon or any other suitable material. Although a die may be typically referred to herein as a component coupled to the surface 112 of the substrate 106, any electronic device, passive electronics, or other component may be used instead of or in addition to a die.

As the temperature of the electronic device 100 changes (e.g., due to heat generated by operation of the electronic device 100, heat released after soldering operations are complete, and/or a change in the ambient temperature), the components of the electronic device 100 may undergo thermal expansion. The degree and direction of the thermal expansion of various components of the electronic device 100 may depend on the material properties of the components (e.g., the coefficient of thermal expansion), the structure and topology of the components, the manner in which various ones of the components are mechanically coupled, the warpage shape and magnitude, joint collapse properties, contact pad size and type, and the distribution of heat within the electronic device 100. Dies and other such components may generate significant heat during operation, and thus may cause significant local deformation within the electronic device 100. In some embodiments, a decrease in ambient temperature may cause significant deformation.

FIG. 5 illustrates deformation of the electronic device 100 as a result of a temperature change in the electronic device 100. This temperature change may be caused by heat generated by the die 108, for example, or a change in the ambient temperature surrounding the electronic device 100. In the scenario of FIG. 5, the temperature change has caused the substrate 106 of the IC package 102 to bow "upward," and has caused the circuit board 104 to bow "downward." The degree of deformation of the substrate 106 and/or the circuit board 104 may be greatest proximate to the die 108. The deformation of the substrate 110 and/or the circuit board 104 may cause the solder joints 124 to deform in response. For example, the solder joint 124a is illustrated as having elongated in response to the "separation" of the edges of the substrate 106 and the circuit board 104. In contrast, solder joints 124 closer to the die 108 may be "compressed" rather than elongated, with their widths increasing as a result. When two solder joints 124 undergoing such compression are close enough together that they come in contact, a solder bridge is formed and a "short" may occur. In FIG. 5, the solder joints 124b and 124c have come in contact, forming a solder bridge. The shape and degree of deformation shown in FIG. 5 is simply illustrative, and in other scenarios, the IC package 102 and the circuit board 104 may bow in a "same" direction, rather than in "opposite" directions as shown, or in any combination of directions.

The risk of solder bridging may increase as packages and circuit boards (e.g., motherboards) continue to get thinner, and thus more readily warp. Second-level interconnects in surface mount devices may be particularly susceptible to the solder bridging phenomena discussed above. Importantly, manufacturers of IC packages may not be able to control the properties of the contact pads used by circuit board manufacturers (e.g., the original equipment manufacturers or original design manufacturers that produce the motherboards on which the IC packages will be mounted). Thus, solutions directed to the circuit board on which the IC packages may be mounted are not useful from the perspective of IC package design.

Other thermo-mechanical phenomena may be relevant to the performance and reliability of electronic devices. For example, as the temperature of an electronic device undergoes multiple cycles of low temperatures alternating with high temperatures, the repetitive deformation of the components of the electronic device may exceed the elasticity of the components and cause them to mechanically fail. Solder joints may be particularly susceptible to mechanical failure due to thermal cycling (a phenomenon referred to as "solder fatigue"). An example of a temperature cycle that may be used during product testing may include 15 minutes at a low temperature (e.g., −40 degrees Celsius), 15 minutes to heat the product to a high temperature (e.g., 125 degrees Celsius), 15 minutes at the high temperature, and then 15 minutes to cool the product back down to the low temperature.

Figure 6:
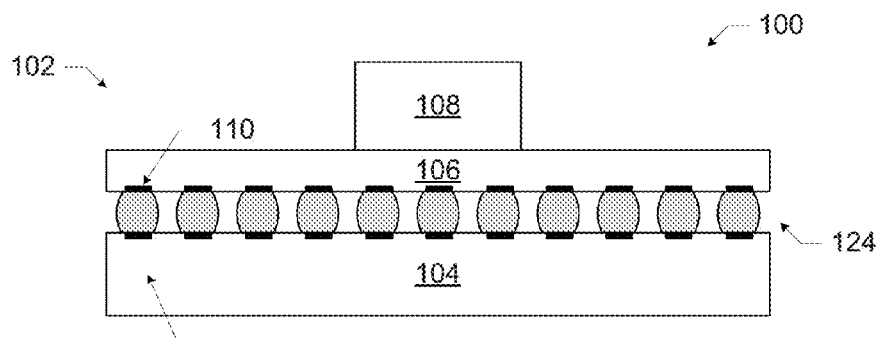
FIGS. 6-9 illustrate a scenario in which repetitive deformation of an electronic device results in failure of multiple solder joints.
Figure 7:
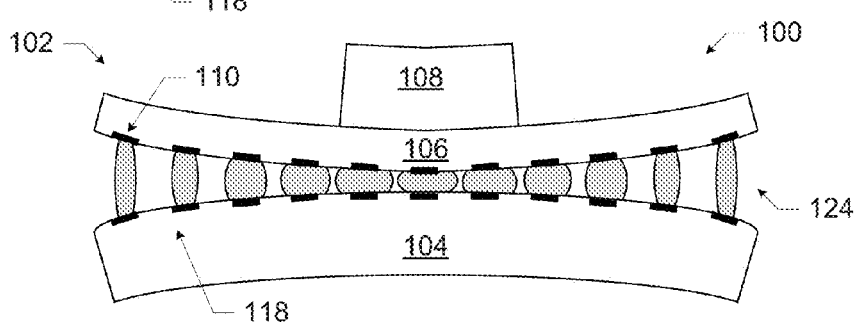
Figure 8:
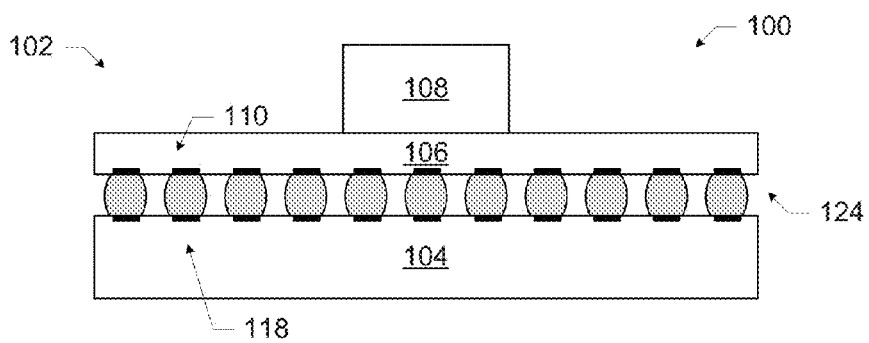
Figure 9:
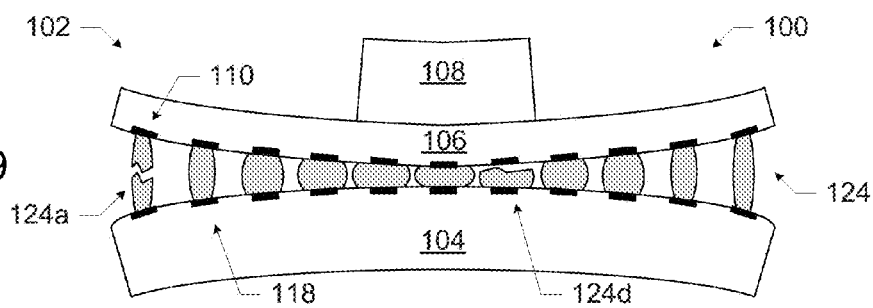

FIGS. 6-9 illustrate a scenario in which repetitive deformation of the electronic device 100 results in failure of multiple solder joints 124. FIG. 6 is a reproduction of FIG. 4, illustrating an electronic device 100 that is not generating significant heat or is otherwise operating in a stable ambient temperature environment such that the components of the electronic device 100 do not undergo significant thermal expansion. FIG. 7 is a reproduction of FIG. 5, illustrating deformation of the electronic device 100 of FIG. 6 as a result of a temperature change. FIG. 8 illustrates the electronic device 100 subsequent to "recovering" from the altered temperature state of FIG. 7. As illustrated in FIG. 8, none of the solder joints 124 may have yet failed. FIG. 9 illustrates the electronic device 100 after a second round of deformation as a result of the temperature change. As shown in FIG. 9, one or more of the solder joints 124 may have failed as a result of the cycling. In particular, the solder joint 124a is illustrated as having cracked along its length such that the flow of electrical signals between the corresponding contact pads of the IC package 102 and the circuit board 104 is interrupted. The solder joint 124d is illustrated as having separated from its corresponding contact pad 110, interrupting the flow of electrical signals between the corresponding contact pad of the IC package 102 and the circuit board 104.

The reliability of electronic devices under changing thermal conditions may be characterized by a thermal cycling on board (TCOB) count, which quantifies the number of thermal cycles an electronic device can withstand before failure. The specifications for electronic devices may include a desired TCOB count that must be achieved for the electronic device to pass inspection. A number of conditions may affect the achievable TCOB count of the electronic device, including size and shape of the IC package, standoff between the IC package in the circuit board to which the IC package is coupled, solder joint heights, the quality of the surface of the contact pads, the available surface area of the contact pads, the contact pad stack, and the buildup and materials of the dielectrics included in the electronic device. For example, if solder stop resist is present on the surface of a contact pad (forming a solder stop mask), the height and arrangement of the solder stop resist may impact the achievable TCOB count. Existing approaches to improving the TCOB count of electronic devices have included adjusting the number of solder joints, under filling the solder joints, using under bump metallization, changing the composition of the solder, changing the amount of solder, or changing the package size. These approaches typically lead to higher costs due to additional material or increased footprint.

Figure 10:
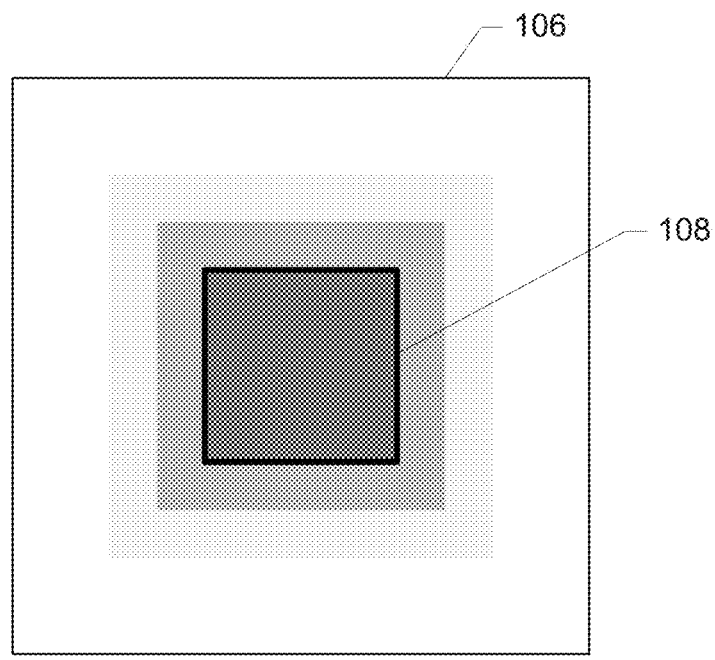
FIG. 10 highlights different regions in an electronic device that may be more or less susceptible to solder bridging.

As noted above, the degree of thermal expansion of various components of an electronic device (and thereby the susceptibility to thermal damage of the component and/or neighboring components) may be a function of the heat distribution and the manner in which various components are coupled. Different thermo-mechanical phenomena may be more of a concern in different portions of the electronic device. For example, solder joints that may be particularly susceptible to bridging may not be particularly susceptible to thermal cycling failures, and vice versa. For example, FIG. 10 highlights different regions in an electronic device (from a top view) that may be more or less susceptible to solder bridging. The electronic device 100 may include a die 108 on a substrate 106 (e.g., included in the IC package 102). In some embodiments, the substrate 106 may include a mold compound in which the die 108 is disposed. In particular, FIG. 10 includes differently shaded areas that represent the degree to which solder joints in those areas may be susceptible to solder bridging, with darker shading indicating higher susceptibility. As illustrated in FIG. 10, solder joints under the die 108 may be most susceptible to solder bridging, with susceptibility decreasing as distance from the die 108 increases.

Figure 11:
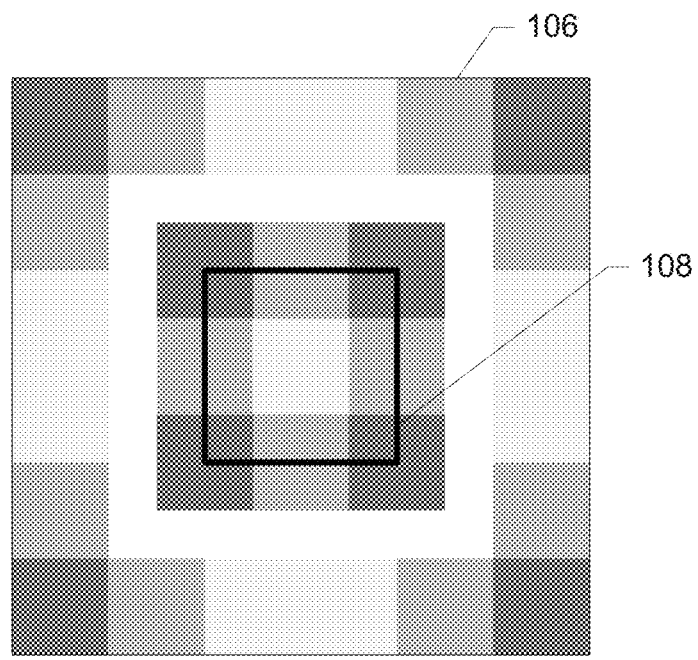
FIG. 11 highlights different regions in an electronic device that may be more or less susceptible to thermal cycling failures.

FIG. 11 highlights different regions in an electronic device (from a top view) that may be more or less susceptible to thermal cycling failures. As discussed above with reference to FIG. 10, the electronic device 100 may include a die 108 on a substrate 106 (e.g., included in the IC package 102). In particular, FIG. 11 includes differently shaded areas that represent the degree to which solder joints in those areas may be susceptible to thermal cycling failures, with darker shading indicating higher susceptibility. As illustrated in FIG. 11, solder joints proximate to edges of components may be most susceptible to thermal cycling failures, with susceptibility decreasing as the distance from the edges increases.

As noted above, various embodiments of the contact pads disclosed herein may provide improved thermo-mechanical performance, as well as additional or alternative performance advantages, over conventional contact pads. A number of examples of improved contact pads are illustrated in the subsequent FIGS. and discussed in detail below.

Figure 12:
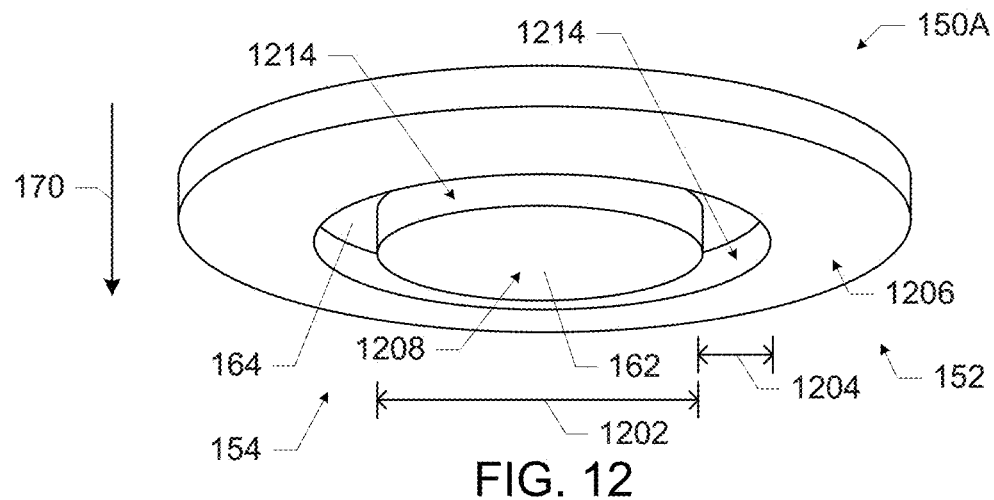
FIGS. 12 and 13 illustrate an example of a contact pad having a metal projection portion and a metal recess portion, in accordance with various embodiments.
Figure 13:
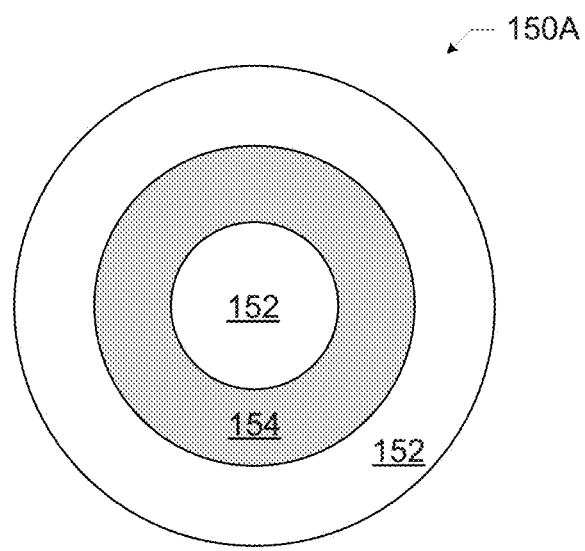

FIGS. 12 and 13 illustrate an example of a contact pad 150A, in accordance with various embodiments. In particular, FIG. 12 is a perspective view of the contact pad 150A and FIG. 13 is a top view of the contact pad 150A. The contact pad 150A may have a metal projection portion 152 and a metal recess portion 154. The metal projection portion 152 may have a solder contact surface 162, and the metal recess portion 154 may have a solder contact surface 164. As shown, the solder contact surface 162 may be substantially parallel to the solder contact surface 164, but may be spaced away from the solder contact surface 164 (e.g., in the direction 170 normal to the solder contact surface 162). The solder joints disclosed herein (e.g., the solder joint 124) may include any suitable solder material, such as tin, gold, and copper, among others. Various dimensions of the contact pad 150A may include a diameter 1202 and a width 1204. As noted above with reference to the conventional contact pad 110, a portion of solder stop resist (not shown) may be disposed on the surface 114 and may extend onto the contact pad 150A (or any of the contact pads disclosed herein), thus reducing the size of the contact area between the solder joint 124 and the contact pad 150A (or other contact pad) from the nominal dimensions of the contact pad 150A (or other contact pad).

The metal projection portion 152 of the contact pad 150A may have an outer portion 1206 and an inner portion 1208. The inner portion 1208 may be defined by sidewalls 1214. As shown, the footprint of the outer portion 1206 may be substantially annular. As used herein, the term "annular" may refer to shapes formed by the area between an outer perimeter shape and an inner perimeter shape, and may include circular annuli, rectangular annuli, oval annuli, polygonal annuli, or annuli formed by any other regular or irregular shapes. For example, an annulus may be defined by the area between an outer circle and an inner rectangle.

Figure 14:
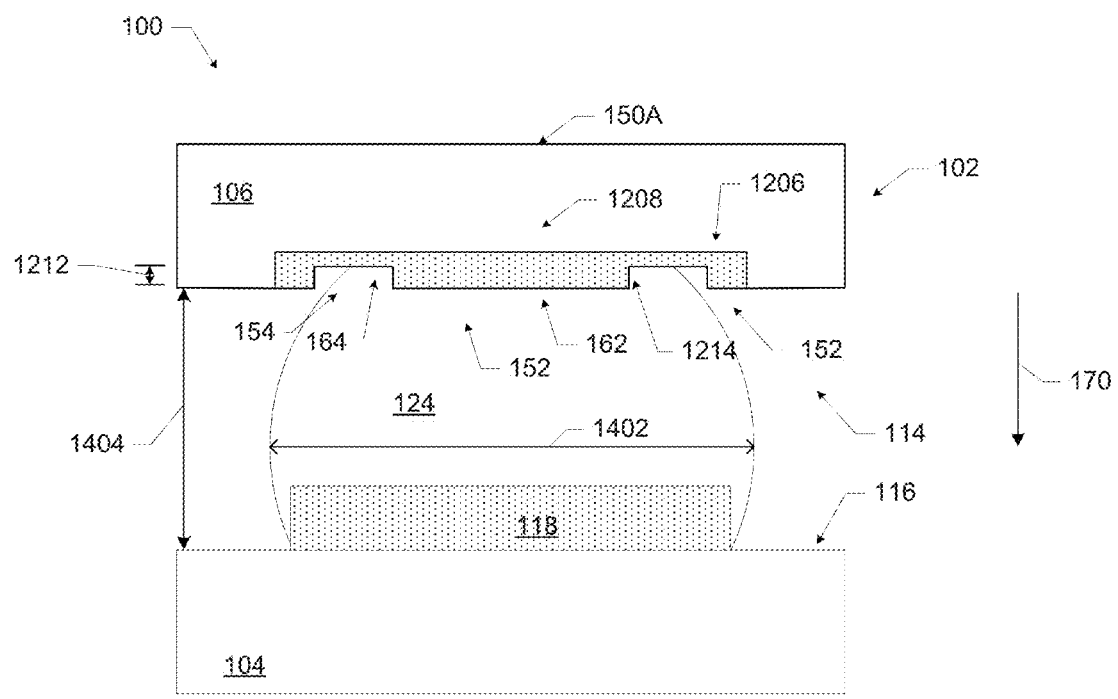
FIG. 14 is a side view of a portion of an electronic device in which the contact pad of FIGS. 12 and 13 is disposed on a surface of a substrate of an IC package, in accordance with various embodiments.

FIG. 14 is a side view of a portion of an electronic device 100 in which the contact pad 150A is disposed on a surface 114 of a substrate 106 of an IC package 102, and a solder joint 124 electrically and mechanically couples the contact pad 150A with a contact pad 118 disposed on a circuit board 104. The substrate 106 may have a surface 112 opposite to the surface 114. A die or other electronic component (not shown) may be disposed on the surface 112. The surface 114 of the substrate 106 may be spaced away from a surface 116 of the circuit board 104 by a spacing 1404. The solder joint 124 may have a width 1402.

As discussed above with reference to FIG. 3, the IC package 102 of FIG. 14 may include multiple contact pads. In some embodiments, one or more of these contact pads may take the form of contact pad 150A, each of which may be soldered to a corresponding contact pad 118 on the circuit board 104 to enable the flow of electrical signals between circuitry included in or coupled with the IC package 102 and circuitry coupled to the circuit board 104. For example, an embedded wafer level ball grid array (eWLB) package having an 8 millimeter by 8 millimeter footprint and 0.4 micron pitch may include a die having a 7.2 millimeter by 7.2 millimeter footprint and may be coupled to a circuit board with 316 solder joints, each solder joint formed from a solder ball having a 250 micron diameter. The IC package 102 of FIG. 14 may include contact pads having different configurations than the contact pad 150A, such as the conventional contact pad 110 (FIGS. 1-3) or any of the other contact pads disclosed herein.

As shown in FIG. 14, the solder joint 124 may contact the solder contact surface 162 of the inner portion 1208 of the metal projection portion 152. The solder joint 124 may also contact the sidewalls 1214 of the inner portion 1208 of the metal projection portion 152. The solder joint 124 may also contact the solder contact surface 164 of the metal recess portion 154. In particular, the metal recess portion 154 may form a channel in which some of the solder of the solder joint 124 may be disposed. In some embodiments, solder may be "pulled" toward the metal recess portion 154 by a fluid wicking process along the sidewalls 1214 of the inner portion 1208 of the metal projection portion 152.

Embodiments of contact pads 150 that include metal recess portions in which solder may flow may enable the solder joint 124 to be narrower than achievable with the conventional contact pad 110 (which presents a substantially uniform solder contact surface). By allowing the solder to flow into the metal recess portion, the same volume of solder coupling an IC package and a circuit board separated by a given distance may have a narrower width than achievable with the conventional contact pad 110. For example, because some of the solder of the solder joint 124 may be received in the recess portion 154 of the contact pad 150A, the width 1402 of the solder joint 124 in FIG. 14 may be narrower than the width 130 of the solder joint 124 of FIG. 3, even when the spacing 1404 is equal to the spacing 132. Because the width 1402 of the solder joint 124 with the contact pad 150A may be less than the width 130 of the solder joint 124 with the conventional contact pad 110, the spacing between the solder joint 124 and adjacent solder joints may be increased, and consequently the bridging risk between the solder joint 124 and adjacent solder joints may be decreased.

This improvement may occur even when the volume of solder in the solder joint 124 remains the same. Such an approach may improve over previous solder bridging mitigation techniques, in which the solder volume was reduced to increase the spacing between adjacent solder joints. However, reducing the solder volume may increase the solder joint susceptibility to thermal cycling failures, and thus may lead to decreased reliability overall.

The dimensions of various features of the contact pad 150A may be selected as desired. In particular, the depth 1212, the diameter 1202 and the distance 1204 may be selected as desired. In particular, the dimensions may be selected to achieve a desired "wicking volume" into which solder from the solder joint 124 may be disposed to decrease the width of the solder joint. An upper bound on the wicking volume may be calculated based on the geometry of the contact pad. For example, the wicking volume provided by the metal recess portion 154 of the contact pad 150A may be calculated in accordance with:

$$\text{volume} = \frac{1}{2} * \left( \frac{\pi (D_{inner} + 2*w)^2}{4} - \frac{\pi D_{inner}^2}{4} \right) * \text{depth}$$

where $D_{inner}$ is the diameter 1202, w is the distance 1204, and depth is the depth 1212. In some embodiments, the outer diameter of the contact pad 150A may be approximately 300 microns. In some embodiments, the diameter 1202 may be approximately 150 microns, and the width 1204 may be approximately 25 microns.

FIGS. 15-18 are top views of additional embodiments of contact pads having metal projection portions 152 and metal recess portions 154, wherein a solder contact surface of the metal recess portion 154 is spaced away from a solder contact surface of the metal projection portion 152. Any of the embodiments of contact pads discussed below with reference to FIGS. 15-18 may be disposed on a substrate of an IC package, such as the IC package 102, and may be used to couple the IC package to a circuit board. In FIGS. 15-18, shaded regions indicate the metal recess portion 154, while the unshaded regions indicate the metal projection portion 152 (e.g., as illustrated in FIG. 13 with reference to the contact pad 150A). As discussed above with reference to the contact pad 150A of FIGS. 12-14, the dimensions of various features of the contact pads of FIGS. 15-18 may be selected as desired. For example, the distance between the solder contact surface of the metal projection portion 152 and the solder contact surface of the metal recess portion 154 (analogous to the depth 1212 of the contact pad 150A of FIGS. 12-14) may be selected as desired. The contact pads of FIGS. 15-18 may be formed using any desired process. For example, in some embodiments, the contact pads of FIGS. 15-18 may be formed by laser milling the metal recess portion 154 as a "dimple" in the surface of a conventional contact pad (such as the conventional contact pad 110). In some embodiments, the contact pads of FIGS. 15-18 may be formed by a plating or wet etch process, followed by lithography (e.g., as discussed below with reference to FIGS. 44-57). In some embodiments, the outer diameter of the contact pads illustrated in FIGS. 15-18 may be approximately 300 microns.

Figure 15:
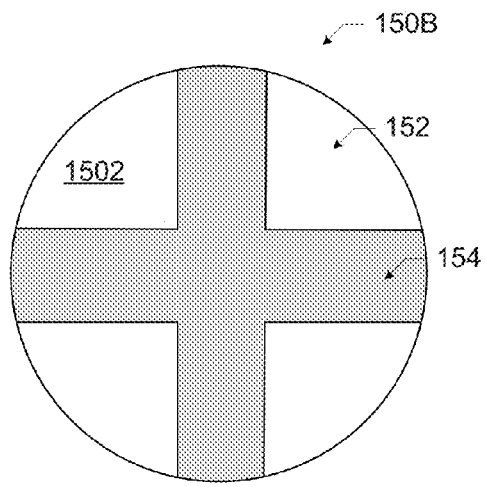
FIGS. 15-18 are top views of additional embodiments of contact pads having metal projection portions and metal recess portions.

FIG. 15 illustrates a contact pad 150B in which the metal recess portion 154 may have a substantially cross-shaped footprint. The metal projection portion 152 may include multiple pillars 1502, each having a substantially semicircular footprint. Although FIG. 15 illustrates an embodiment in which the metal projection portion 152 includes four pillars 1502 with semicircular footprints, other embodiments may include fewer pillars 1502 with semicircular footprints or more pillars 1502 with semicircular footprints. For example, in some embodiments, the metal recess portion 154 may have a substantially Y-shaped footprint, and the metal projection portion 152 may include three pillars 1502. In various ones of the embodiments disclosed herein, the metal projection portion 152 may include a single pillar (e.g., instead of multiple pillars).

Figure 16:
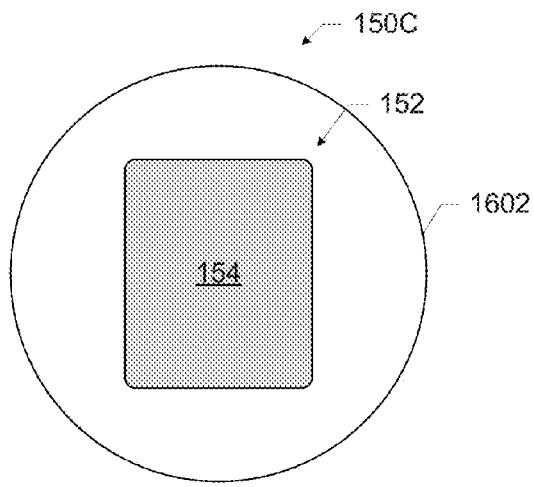

FIG. 16 illustrates a contact pad 150C in which the metal recess portion 154 may have a substantially rectangular footprint. The metal projection portion 152 may have a substantially circular outer perimeter 1602. Although FIG. 16 illustrates an embodiment in which the metal recess portion 154 includes a single metal recess approximately centered within the substantially circular outer perimeter 1602 of the metal projection portion 152, other embodiments may include one or more rectangular recesses that may be distributed in any desired manner in the contact pad 150C.

Figure 17:
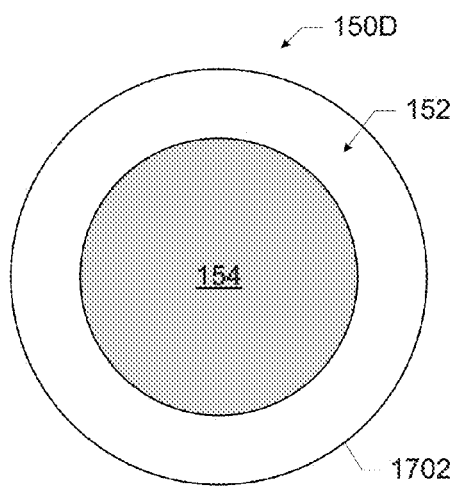

FIG. 17 illustrates a contact pad 150D in which the metal recess portion 154 may have a substantially circular footprint. The metal projection portion 152 may have a substantially circular outer perimeter 1702. Although FIG. 17 illustrates an embodiment in which the metal recess portion 154 includes a single metal recess approximately centered within the substantially circular outer perimeter 1702 of the metal projection portion 152, other embodiments may include one or more circular recesses that may be distributed in any desired manner in the contact pad 150D. In general, recesses having any desired shape or combination of shapes may be included in the contact pad 150D.

Figure 18:
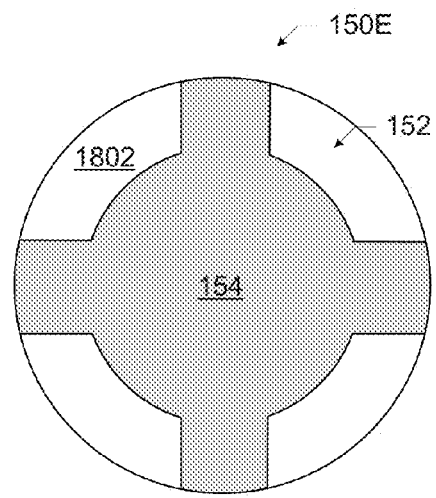

FIG. 18 illustrates a contact pad 150E in which the metal recess portion 154 may have a footprint that includes a cross-shaped portion superimposed on a substantially circular portion. The metal projection portion 152 may include multiple pillars 1802, each having a footprint corresponding to a portion of a circular annulus. As discussed above with reference to FIG. 15, although FIG. 18 illustrates an embodiment in which the metal projection portion 152 includes four pillars 1802, other embodiments may include fewer pillars 1802 or more pillars 1802 (e.g., by adjusting the number of "arms" in the cross-shaped portion of the metal recess portion 154).

As discussed above with reference to the contact pad 150A, the dimensions of various features of the contact pads of FIGS. 15-18 may be selected as desired. In particular, the dimensions may be selected to achieve a desired "wicking volume" into which solder from a solder joint may be disposed to decrease the width of the solder joint. As noted above, an upper bound on the wicking volume may be calculated based on the geometry of the contact pad. For example, the wicking volume provided by the metal recess portion 154 of the contact pad 150B may be calculated in accordance with:

$$\text{volume} = \frac{1}{2} * \left(\frac{\pi D_{inner}^2}{4}\right) * \text{depth}$$

where $D_{inner}$ is the diameter of the substantially circular metal recess portion 154 and depth is the depth of the metal recess portion 154 relative to the solder contact surface of the metal projection portion 152. In some embodiments, the diameter of the substantially circular metal recess portion 154 of the contact pad 150B may be approximately 8 mils (where 1 mil is equal to one thousandth of an inch), and the overall diameter of the substantially circular contact pad 150B may be approximately 15 mils.

Various ones of the contact pads disclosed herein may increase the active contact area between the solder joint and the contact pad relative to the conventional contact pad 110 by changing the shape and topology of the contact pad. Electronic devices including contact pads with the shapes and topologies disclosed herein may provide improved TCOB counts over electronic devices including conventional contact pads, without requiring changes in the footprints of the components of electronic devices, the composition of the solder, or the number of solder joints, for example. Moreover, contact pads with the shapes and topologies disclosed herein may be manufactured by changing the pad mask design and/or adding an additional etching or lithography step, and thus may be implemented at much lower cost relative to existing approaches to improving TCOB counts.

Figure 19:
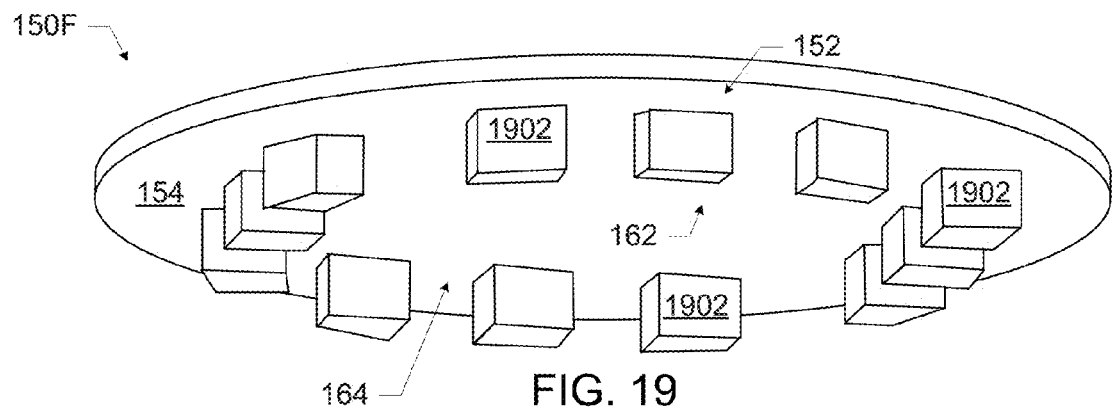
FIGS. 19 and 20 illustrate an example of a contact pad having a metal projection portion and a metal recess portion, in accordance with various embodiments.
Figure 20:
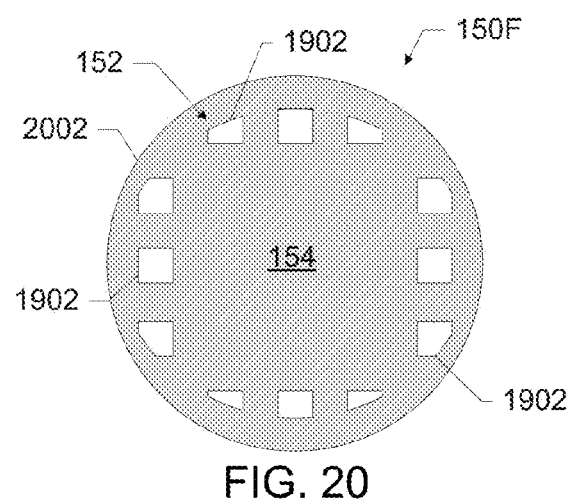

FIGS. 19 and 20 illustrate an example of a contact pad 150F, in accordance with various embodiments. In particular, FIG. 19 is a perspective view of the contact pad 150F, and FIG. 20 is a top view of the contact pad 150F. The contact pad 150F may have a metal projection portion 152 and a metal recess portion 154. The metal projection portion 152 may have a solder contact surface 162, and the metal recess portion 154 may have a solder contact surface 164. As shown, the solder contact surface 162 may be substantially parallel to the solder contact surface 164, but may be spaced away from the solder contact surface 164 (e.g., in the direction 170 normal to the solder contact surface 162, as illustrated in FIG. 12).

In the embodiment of FIGS. 19 and 20, the metal projection portion 152 may include multiple pillars 1902. The pillars 1902 may be arranged substantially in a ring formation. As used herein, the term "ring" may refer to any closed shape, and may include circular rings, rectangular rings, oval rings, polygonal rings, or rings formed by any other regular or irregular shape. As shown in FIG. 20, the pillars 1902 may be arranged substantially in alignment with the sides of a square.

The footprints of the pillars 1902 may take any desired shape. For example, in some embodiments, at least one of the pillars 1902 may have a substantially rectangular footprint. As shown in FIG. 20, one or more of the pillars 1902 may have a footprint that is the shape of a rectangle with one or more rounded corners. These rounded corners may echo the substantially circular outer perimeter 2002 of the contact pad 150F. Any desired number and arrangement of pillars 1902 may be included in the contact pad 150F, and several embodiments with varying numbers, arrangements, and shapes of pillars are discussed below with reference to subsequent figures.

Figure 21:
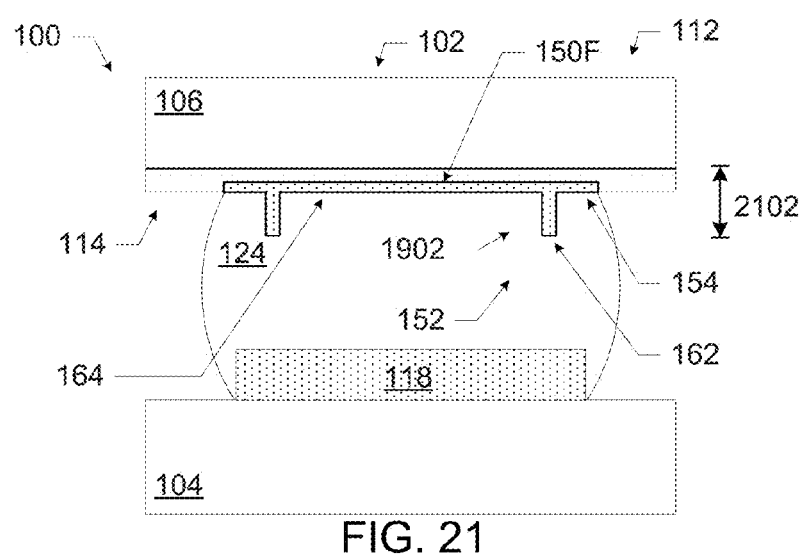
FIG. 21 is a side view of a portion of an electronic device in which the contact pad of FIGS. 19 and 20 is disposed on a surface of a substrate of an IC package, in accordance with various embodiments.

FIG. 21 is a side view of a portion of an electronic device 100 in which the contact pad 150F is disposed on a surface 114 of a substrate 106 of an IC package 102, and a solder joint 124 electrically and mechanically couples the contact pad 150F with a contact pad 118 disposed on a circuit board 104. The substrate 106 may have a surface 112 opposite to the surface 114. A die or other electronic component (not shown) may be disposed on the surface 112. As discussed above with reference to FIG. 3, the IC package 102 of FIG. 21 may include multiple contact pads 150F, each of which may be soldered to a corresponding contact pad 118 on the circuit board 104 to enable the flow of electrical signals between circuitry included in or coupled with the IC package 102 and circuitry coupled to the circuit board 104. The IC package 102 of FIG. 21 may include contact pads having different configurations than the contact pad 150F, such as the conventional contact pad 110 (FIGS. 1-3) or any of the other contact pads disclosed herein.

As shown in FIG. 21, the solder joint 124 may contact the solder contact surface 162 of the metal projection portion 152. The solder joint 124 may also contact the solder contact surface 164 of the metal recess portion 154. As shown in FIG. 21, at least some of the pillars 1902 of the metal projection portion 152 may extend into the solder of the solder joint 124.

The dimensions of various features of the contact pad 150F may be selected as desired. In particular, the height 2102 of the pillars 1902, the dimensions of the footprints of the pillars 1902, and the spacing between the pillars 1902 may be selected as desired. In some embodiments, the outer diameter of the contact pad 150F may be approximately 300 microns. In some embodiments, the height 2102 of the pillars 1902 may be approximately 18 microns. In some embodiments, the footprint of the pillars 1902 may be approximately 25 microns by 25 microns, and adjacent pillars 1902 may be spaced apart by 25 microns.

The contact pad 150F may be particularly advantageous for increasing TCOB counts. By extending into the solder joint, the pillars 1902 may act as mechanical stabilization for the solder joint 124. The contact pad 150F may increase the achievable number of TCOB counts relative to the conventional contact pad 110 for solder joints located proximate to the corner of an IC package and for solder joints located proximate to the corner of a die included in the IC package.

FIGS. 22-36 and 38 are top views of additional embodiments of contact pads having metal projection portions 152 and metal recess portions 154, wherein a solder contact surface of the metal recess portion 154 is spaced away from a solder contact surface of the metal projection portion 152. Any of the embodiments of contact pads discussed below with reference to FIGS. 22-36 and 38 may be disposed on a substrate of an IC package, such as the IC package 102, and may be used to couple the IC package to a circuit board. In FIGS. 22-36 and 38, shaded regions indicate the metal recess portion 154, while the unshaded regions indicate the metal projection portion 152 (e.g., as illustrated in FIG. 20 with reference to the contact pad 150F). In various ones of FIGS. 22-36 and 38, striped regions indicate areas in which a solder stop resist may be deposited (and thus to which solder may not attach). Suitable solder stop resists may have sufficient resolution to achieve the patterning of the various structures illustrated.

As discussed above with reference to the contact pad 150A of FIGS. 12-14 and the contact pad 150F of FIGS. 19-21, the dimensions of various features of the contact pads of FIGS. 22-39 may be selected as desired. For example, the distance between the solder contact surface of the metal projection portion 152 and the solder contact surface of the metal recess portion 154 (e.g., the height 2102 of the pillars 1902 of the contact pad 150F) may be selected as desired. In some embodiments, the outer diameter of the contact pads illustrated in FIGS. 22-39 may be approximately 300 microns. In use, the metal projection portions 152 of various ones of the contact pads discussed below with reference to FIGS. 22-39 may extend into the solder joint and act as mechanical stabilization for the solder joint, improving the achievable TCOB counts relative to the conventional contact pad 110.

Figure 22:
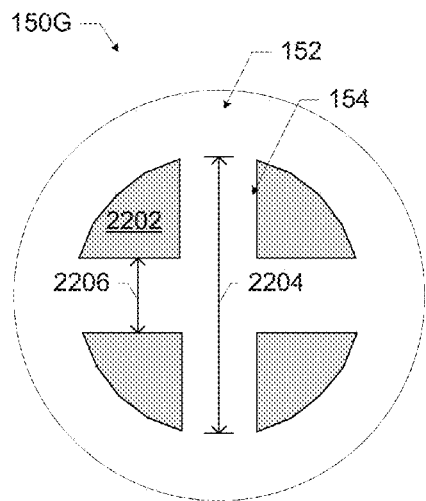

FIG. 22 illustrates a contact pad 150G in which the metal recess portion 154 may have a footprint including a cross shape centered in an annulus. The metal projection portion 152 may include multiple pillars 2202, each having a substantially semicircular footprint. Although FIG. 22 illustrates an embodiment in which the metal projection portion 152 includes four pillars 2202 with semicircular footprints, other embodiments may include fewer pillars 2202 with semicircular footprints or more pillars 2202 with semicircular footprints (e.g., as discussed above with reference to FIG. 15). In some embodiments, the diameter 2204 may be approximately 200 microns. In some embodiments, the distance 2206 may be approximately 50 microns.

Figure 23:
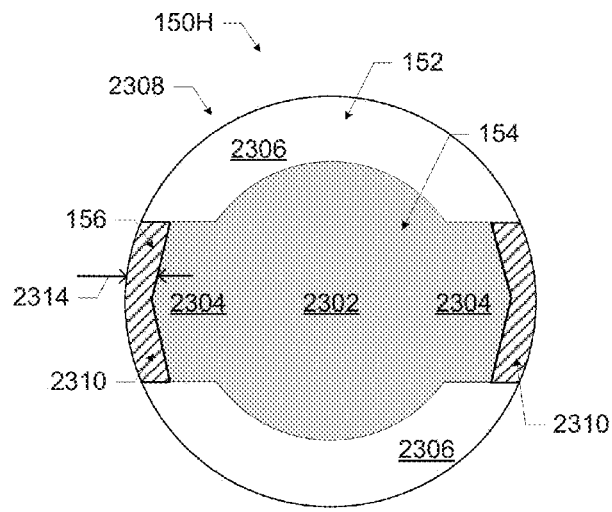

FIG. 23 illustrates a contact pad 150H in which the metal recess portion 154 may have a footprint including a circle 2302 flanked by two polygonal segments 2304. The metal projection portion 152 may include multiple pillars 2306, each having a footprint shaped substantially as a portion of an annulus. The pillars 2306 may be disposed adjacent to the substantially circular outer perimeter 2308 of the contact pad 150H. The contact pad 150H may also include a solder stop resistsolder stop resist portion 156, which may take the form of two solder stop resistsolder stop resist areas 2310 adjacent to the outer perimeter 2308 and the polygonal segments 2304 of the metal recess portion 154. In some embodiments, the diameter of the circle 2302 may be approximately 200 microns. In some embodiments, the distance 2314 may be approximately 75 microns.

Figure 24:
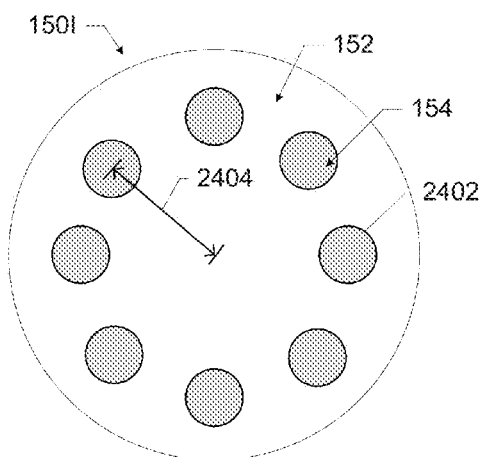

FIG. 24 illustrates a contact pad 150I in which the metal recess portion 154 may have a footprint including multiple circular regions 2402 arranged substantially in a circular ring formation. The metal projection portion 152 may surround the multiple circular regions 2402. In some embodiments, the circular regions 2402 may be arranged substantially evenly in a ring formation (e.g., as shown in FIG. 24), or may not be arranged evenly in a ring formation. Although the ring formation illustrated in FIG. 24 is substantially circular, a ring formation of any other shape may be used. Additionally, other embodiments may include non-circular regions (e.g., rectangular regions) instead of or in addition to the circular regions 2402. In some embodiments, the distance 2404 may be approximately 90 microns. In some embodiments, a diameter of one of the circular regions 2402 may be approximately 50 microns.

Figure 25:
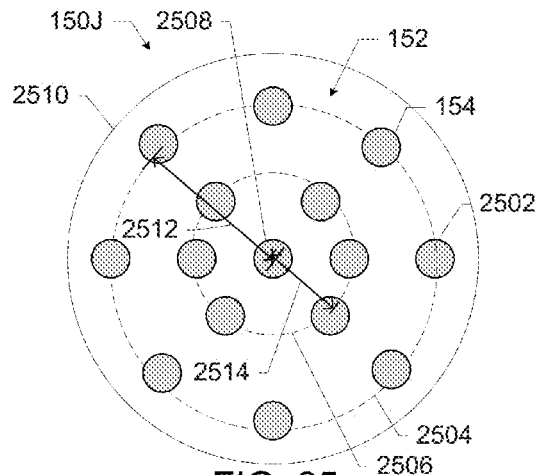

FIG. 25 illustrates a contact pad 150J in which the metal recess portion 154 may have a footprint including multiple circular regions 2502 arranged in a first ring formation 2504, a second ring formation 2506, and a center circular region 2508. The metal projection portion 152 may surround the multiple circular regions 2502. As shown in FIG. 25, the first ring formation 2504 may be disposed between the substantially circular outer perimeter 2510 of the contact pad 150J and the second ring formation 2506. The circular regions 2502 in the first ring formation 2504 may be distributed substantially evenly around the ring formation 2504, while the circular regions 2502 of the second ring formation 2506 may not be disposed evenly around the second ring formation 2506, as shown. As discussed above with reference to FIG. 24, although the ring formations illustrated in FIG. 25 are substantially circular, ring formations of any other shape may be used. Additionally, other embodiments may include non-circular regions (e.g., rectangular regions) instead of or in addition to the circular regions 2502. In some embodiments, the distance 2512 may be approximately 100 microns. In some embodiments, the distance 2514 may be approximately 50 microns. In some embodiments, a diameter of one of the circular regions 2502 may be approximately 30 microns.

Figure 26:
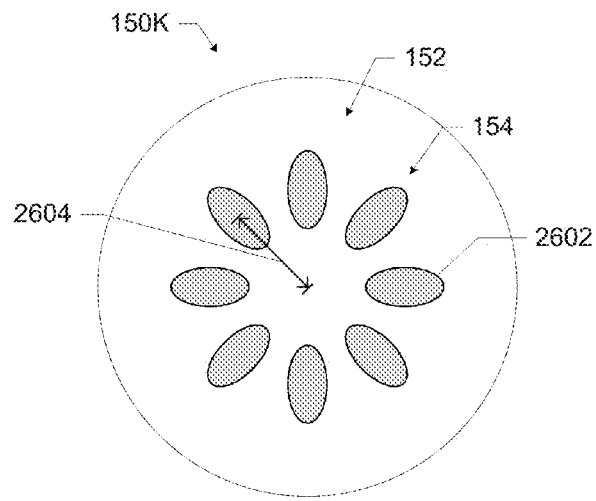

FIG. 26 illustrates a contact pad 150K in which the metal recess portion 154 may have a footprint including multiple oval regions 2602 arranged in a ring formation. The metal projection portion 152 may surround the multiple oval regions 2602. Although the oval regions 2602 illustrated in FIG. 26 are distributed substantially evenly around the ring formation, in other embodiments, the oval regions 2602 may not be disposed evenly around the ring formation. In some embodiments, the distance 2604 may be approximately 75 microns. In some embodiments, the major diameter of an individual oval region 2602 may be approximately 50 microns. In some embodiments, the minor diameter of an individual oval region 2602 may be approximately 30 microns.

Figure 27:
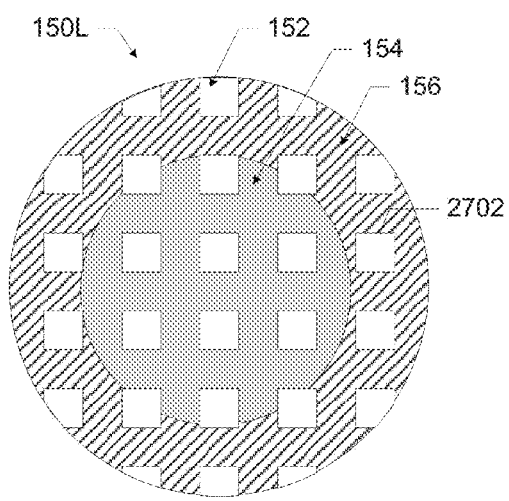

FIG. 27 illustrates a contact pad 150L in which the metal recess portion 154 may have a substantially circular footprint, and may be surrounded by a substantially annular solder stop resist portion 156. The metal projection portion 152 may include multiple portions 2702 arranged in a regular array over the footprint of the metal recess portion 154 and the footprint of the solder stop resist portion 156. As illustrated in FIG. 27, the portions 2702 may have a substantially rectangular footprint (e.g., a substantially square footprint); in other embodiments, portions having footprints having other shapes may be used instead of or in addition to substantially rectangular footprints. In some embodiments, an individual portion 2702 may have a footprint of approximately 25 microns by 25 microns. In some embodiments, adjacent portions 2702 may be spaced apart by 25 microns.

Figure 28:
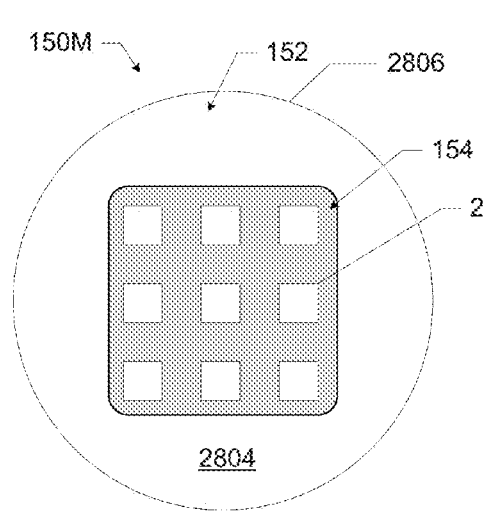

FIG. 28 illustrates a contact pad 150M in which the metal recess portion 154 may have a substantially square footprint. The metal projection portion 152 may include an annular portion 2804 disposed between the outer periphery 2806 of the contact pad 150M and the metal recess portion 154, and may also include multiple portions 2802 disposed within the footprint of the metal recess portion 154. As illustrated in FIG. 28, the portions 2802 may have a substantially rectangular footprint (e.g., a substantially square footprint); in other embodiments, portions having footprints having other shapes may be used instead of or in addition to substantially rectangular footprints. In some embodiments, an individual portion 2802 may have a footprint of approximately 25 microns by 25 microns. In some embodiments, the metal recess portion 154 may have a footprint that extends 25 microns beyond the edges of the portions 2802 in each direction.

Figure 29:
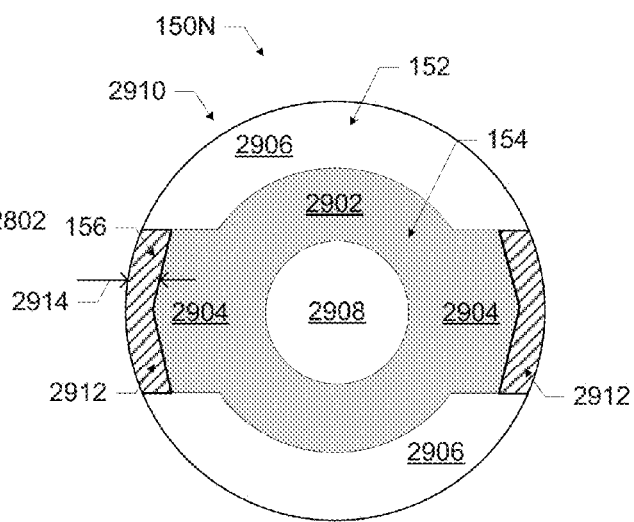

FIG. 29 illustrates a contact pad 150N in which the metal recess portion 154 may have a footprint including a circle 2902 flanked by two polygonal segments 2904. The metal projection portion 152 may include multiple portions 2906, each having a footprint shaped substantially as a portion of an annulus, and a portion 2908 having a substantially circular footprint. The portions 2906 may be disposed adjacent to the substantially circular outer perimeter 2910 of the contact pad 150N. The contact pad 150N may also include a solder stop resist portion 156, which may take the form of two solder stop resist areas 2912 adjacent to the outer perimeter 2910 and the polygonal segments 2904 of the metal recess portion 154. In some embodiments, the diameter of the circle 2902 may be approximately 200 microns. In some embodiments, the diameter of the portions 2908 may be approximately 100 microns. In some embodiments, the distance 2914 may be approximately 75 microns.

Figure 30:
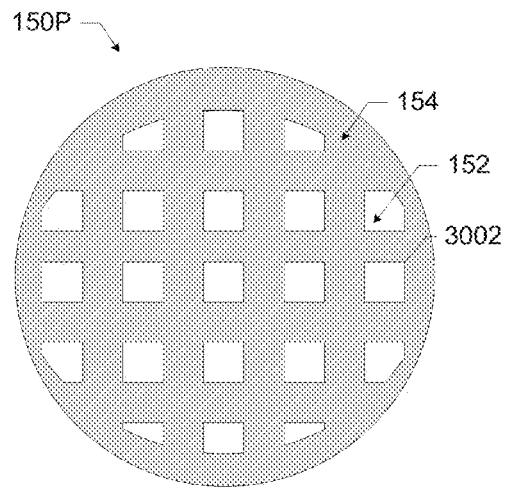

FIG. 30 illustrates a contact pad 150P in which the metal recess portion 154 may have a substantially circular footprint, and may be interrupted by multiple pillars 3002 of the metal projection portion 152. The multiple pillars 3002 may be arranged in a regular array over the footprint of the metal recess portion 154. As illustrated in FIG. 30, some of the pillars 3002 may have a substantially rectangular footprint (e.g., a substantially square footprint); in other embodiments, pillars having footprints having other shapes may be used instead of or in addition to substantially rectangular footprints. In some embodiments, an individual pillar 3002 may have a footprint of approximately 25 microns by 25 microns. In some embodiments, adjacent pillars 3002 may be spaced apart by 25 microns.

Figure 31:
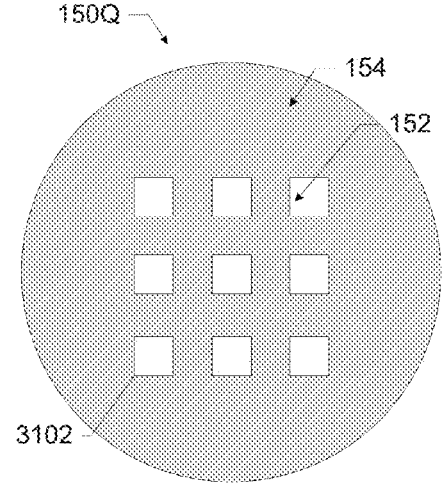

FIG. 31 illustrates a contact pad 150Q in which the metal recess portion 154 may have a substantially circular footprint, and may be interrupted by multiple pillars 3102 of the metal projection portion 152. The multiple pillars 3102 may be arranged in a regular array over a central portion of the footprint of the metal recess portion 154. The contact pad 150Q may be contrasted with the contact pad 150P (FIG. 30), the latter of which includes pillars 3002 extending over the entire footprint of the metal recess portion 154. As illustrated in FIG. 31, some of the pillars 3102 may have a substantially rectangular footprint (e.g., a substantially square footprint); in other embodiments, pillars having footprints having other shapes may be used instead of or in addition to substantially rectangular footprints. In some embodiments, an individual pillar 3102 may have a footprint of approximately 25 microns by 25 microns. In some embodiments, adjacent pillars 3102 may be spaced apart by 25 microns. In some embodiments, a height of an individual pillar 3102 may be approximately 8 microns.

Figure 32:
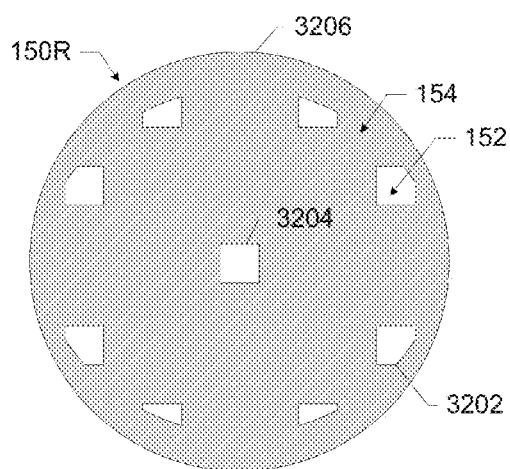

FIG. 32 illustrates a contact pad 150R in which the metal recess portion 154 may have a substantially circular footprint, and may be interrupted by multiple pillars 3202 of the metal projection portion 152. The multiple pillars 3202 may be arranged so as to include a central pillar 3204 and an arrangement of pillars 3202 proximate to the outer perimeter 3206 of the contact pad 150R. The contact pad 150R may be contrasted with the contact pad 150P (FIG. 30), the latter of which includes pillars 3002 extending over the entire footprint of the metal recess portion 154. Some of the pillars 3202 may have a substantially rectangular footprint (e.g., a substantially square footprint); in other embodiments, pillars having footprints having other shapes may be used instead of or in addition to substantially rectangular footprints. In some embodiments, an individual pillar 3202 may have a footprint of approximately 25 microns by 25 microns. In some embodiments, a height of an individual pillar 3202 may be approximately 8 microns.

Figure 33:
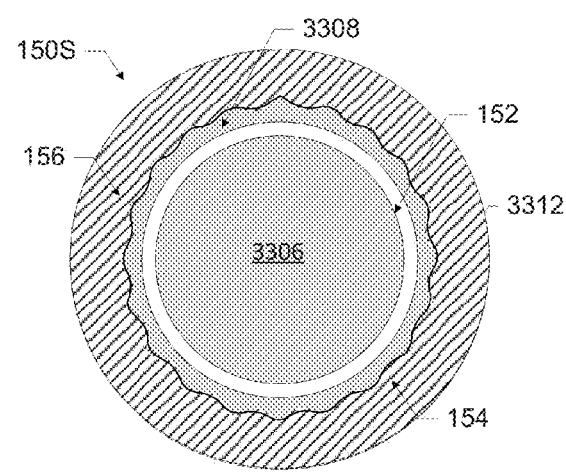

FIG. 33 illustrates a contact pad 150S in which the metal recess portion 154 includes an annular portion 3308 with a wave pattern and a central portion 3306 having a substantially circular footprint. The metal projection portion 152 may have a substantially annular footprint, and may be disposed between the central portion 3306 of the metal recess portion 154 and the outer perimeter 3312 of the contact pad 150S. A solder stop resist portion 156 may be disposed between the semi-annular portion 3308 and the outer perimeter 3312. The dimensions of components of the contact pad 150S may be the dimensions of the corresponding components of the contact pads discussed below with reference to FIGS. 36 and 41.

Figure 34:
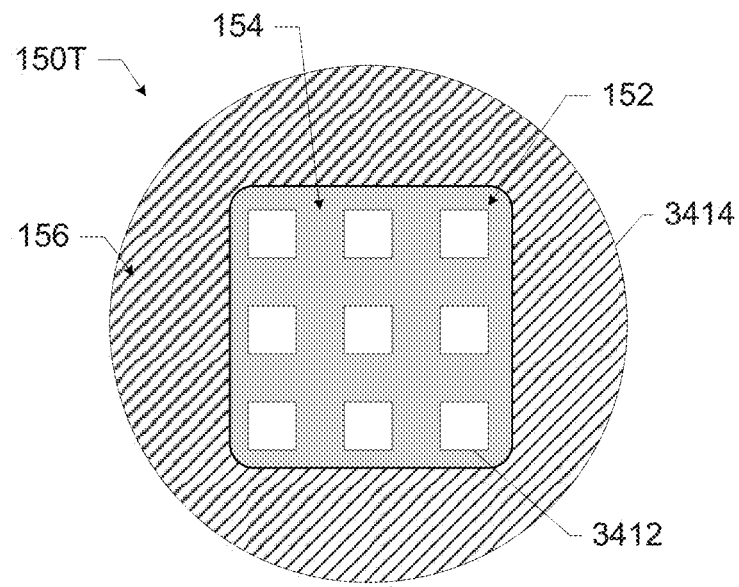

FIG. 34 illustrates a contact pad 150T in which the metal recess portion 154 may have a substantially square footprint. The metal projection portion 152 may include multiple portions 3412 disposed within the footprint of the metal recess portion 154. These multiple portions 3412 and the metal recess portion 154 of the contact pad 150T may take the form of any of the embodiments of the multiple portions 2802 discussed above with reference to FIG. 28. A solder stop resist portion 156 may be disposed between the metal recess portion 154 and the outer perimeter 3414. The dimensions of the components of the contact pad 150T may be the dimensions of the corresponding components of the contact pads discussed with reference to FIG. 28.

Figure 35:
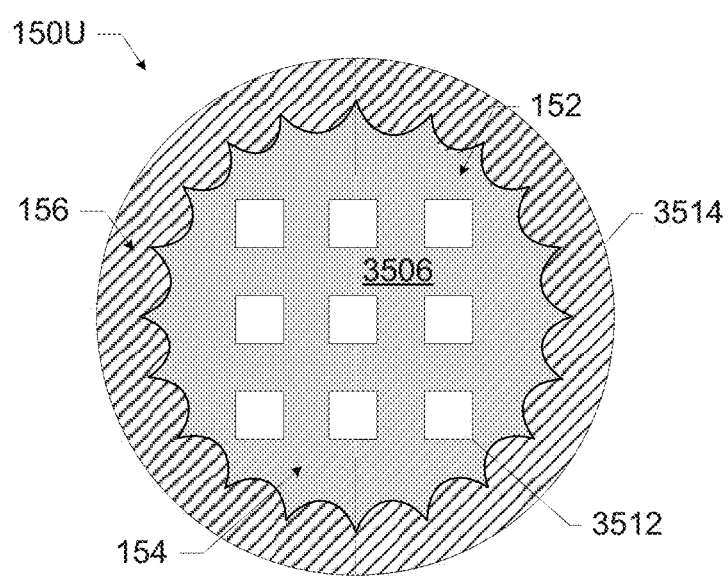

FIG. 35 illustrates a contact pad 150U in which the metal recess portion 154 includes a substantially circular portion 3506 with a wave pattern perimeter. The metal projection portion 152 may include multiple pillars 3506 interrupting the metal recess portion 154 and disposed centrally. A solder stop resist portion 156 may be disposed between the portion 3510 and the outer perimeter 3514 on the first side 3502 of the contact pad 150U. The dimensions of the components of the contact pad 150U may be the corresponding dimensions of the contact pads discussed with reference to FIGS. 31 and 40.

FIG. 36 illustrates a contact pad 150V in which the metal recess portion 154 includes a substantially circular portion 3602 and a substantially annular portion 3604. The metal projection portion 152 may have a substantially annular footprint, and may be disposed between the portions 3602 and 3604 of the metal recess portion 154. FIG. 37 is a side view of the contact pad 150V, illustrating the solder contact surface 162 of the metal projection portion 152 and the solder contact surface 164 of the portions 3602 and 3604 of the metal recess portion 154. In some embodiments, the height 3612 may be approximately 8 microns. In some embodiments, the height 3612 may be approximately 28 microns. In some embodiments, the diameter 3608 may be approximately 200 microns, and the diameter 3610 may be approximately 220 microns.

FIG. 38 illustrates a contact pad 150W in which the metal recess portion 154 has a substantially annular footprint and surrounds the metal projection portion 152. The metal projection portion 152 may have a substantially circular footprint. FIG. 39 is a side view of the contact pad 150W, illustrating the solder contact surface 162 of the metal projection portion 152 and the solder contact surface 164 of the metal recess portion 154. In some embodiments, the height 3812 may be approximately 18 microns and the diameter 3814 may be approximately 200 microns. In some embodiments, the height 3812 may be approximately 28 microns and the diameter 3814 may be approximately 70 microns.

Various ones of the contact pads 150 disclosed herein may provide particular advantages in improving TCOB counts. Having a metal projection portion extend into the solder may stabilize the solder layers, improving TCOB counts. Embodiments of the contact pads 150 having pillars disposed closer to the outer perimeter of the contact pad may increase TCOB counts to a greater degree than contact pads having pillars concentrated closer to the center of the contact pad. For example, the pad 150R of FIG. 32 may exhibit improved performance relative to the pad 150Q of FIG. 31 in some applications. In some applications, increasing the number of pillars of a contact pad without changing their distribution across the contact pad may not substantially affect the TCOB lifetime. For example, the contact pad 150P (FIG. 30) may not exhibit substantially improved performance relative to the contact pad 150R (FIG. 32). Increasing the heights of pillars may improve TCOB lifetime. Using contact pads with outer perimeters having wave patterns may improve TCOB lifetime.

In some embodiments, structures disposed in the outer area of a contact pad may not form a closed ring. A closed ring formation may "protect" the area within the ring from thermo-mechanical stress, and thus absorb all of the thermo-mechanical stress that would otherwise be distributed through the contact pad, reducing the TCOB lifetime. Disrupting an ring formation may prevent creep strain from being concentrated in the outer pad region.

Figure 40:
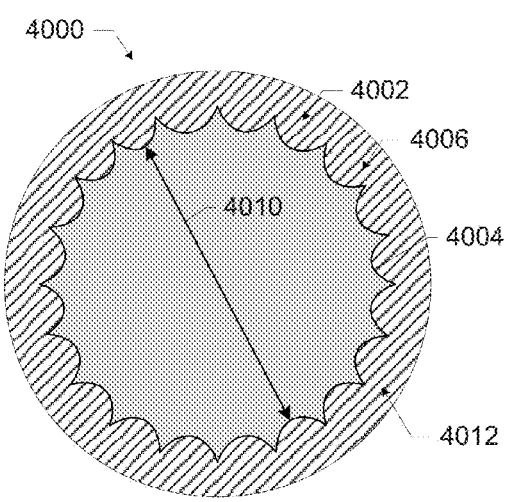
FIGS. 40-42 are views of contact pads having various outer and/or inner perimeters, in accordance with various embodiments.
Figure 41:
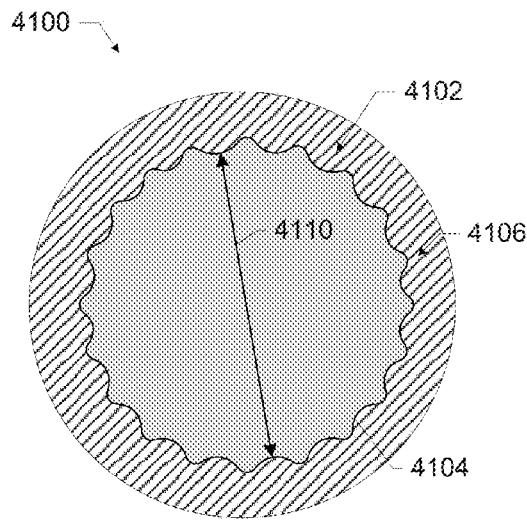
Figure 42:
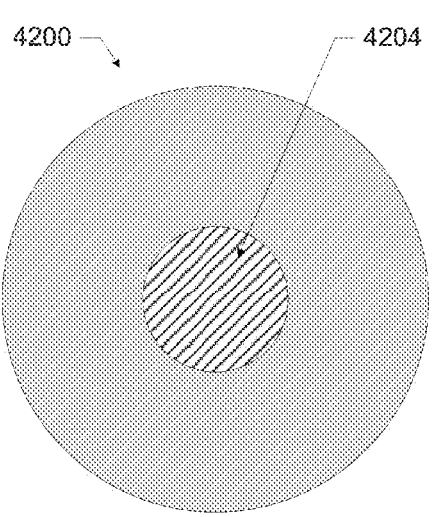

Some embodiments of the contact pads disclosed herein may not include metal projection portions and metal recess portions, but may instead have a substantially planar solder contact surface. These contact pads may differ from the conventional contact pad 110 in their outer and/or inner perimeters. FIGS. 40-42 are top views of examples of such embodiments. Any of the embodiments of contact pads discussed below with reference to FIGS. 40-42 may be disposed on a substrate of an IC package, such as the IC package 102, and may be used to couple the IC package to a circuit board. FIG. 40 illustrates a contact pad 4000 having an outer perimeter 4004 with a wave pattern shape. The outer "tips" 4006 of the outer perimeter 4004 may be peaked, as illustrated. The "depth" of the wave pattern may be approximately 15 microns, and the diameter 4010 may be approximately 240 microns. The pattern of solder stop resist 4012 may enable the wave pattern perimeter 4004 (e.g., with the solder stop resist 4012 patterned on an otherwise circular underlying conductive pad) and any of the other perimeters disclosed herein. The wave pattern perimeter 4004 (and other wave pattern perimeters disclosed herein) may advantageously redirect stress vectors to improve TCOB counts.

FIG. 41 illustrates a contact pad 4100 having an outer perimeter 4104 with a wave pattern shape. The outer "tips" 4106 of the outer perimeter 4104 may be rounded, as illustrated. The "depth" of the wave pattern may be approximately 8 microns, and the diameter 4110 may be approximately 240 microns. FIG. 42 illustrates a contact pad 4200 having a substantially annular footprint. A solder stop resist region 4204 may be disposed in the void of the annular footprint. Contact pads having other footprints, such as x-shaped, square, or star-shaped, may be used.

The inner and/or outer perimeters of the contact pads discussed above with reference to FIGS. 40-42 may be utilized with the topological features of any of the contact pads 150 disclosed herein. For example, any of the contact pads 150 may be formed with an outer perimeter having a wave pattern shape as discussed above with reference to the contact pads 4000 and 4100.

As discussed above (e.g., with reference to FIGS. 10 and 11), different thermo-mechanical phenomena may be more of a concern in different portions of the electronic device. For example, solder joints under a die may be most susceptible to solder bridging, while solder joints proximate to edges of components may be most susceptible to thermal cycling failures. Thus, in various embodiments, an IC package may include different types of solder joints at different locations on the substrate.

For example, an IC package may include any of the contact pads 150 disclosed herein and a conventional contact pad 110 (e.g., a contact pad having a uniform solder contact surface). In some embodiments, a die of the IC package may be disposed closer to the contact pad 150 than to the conventional contact pad 110. In some embodiments, any of the contact pads 150 discussed above with reference to FIGS. 12-18 may be advantageously used "under the shadow" of a die included in an IC package or proximate to a die included in an IC package. In some embodiments, any of the contact pads 150 discussed above with reference to FIGS. 19-39 may be advantageously used proximate to interfaces between different components of an IC package (e.g., proximate to the corner of a die included in the IC package) or proximate to the edges of the IC package itself.

Figure 43:
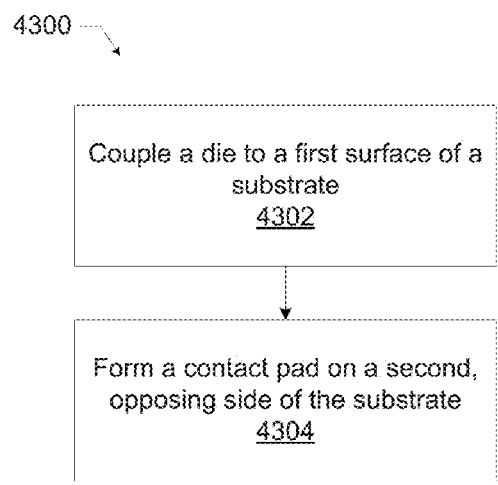
FIG. 43 is a flow diagram of a process for manufacturing an IC package, in accordance with various embodiments.

FIG. 43 is a flow diagram of a process 4300 for manufacturing an IC package, in accordance with various embodiments. Although operations of the process 4300 may be discussed with reference to the IC package 102 and components thereof, this is simply for illustrative purposes and the process 4300 may be utilized to manufacture any suitable IC package.

At 4302, a die may be coupled to a first surface of a substrate. For example, the die 108 may be coupled to the surface 112 of the substrate 106.

At 4304, a contact pad may be formed on a second, opposing surface of the substrate. For example, a contact pad may be formed on the surface 114 of the substrate 106. In some embodiments, the contact pad may include a metal projection portion having a solder contact surface and a metal recess portion having a solder contact surface. The solder contact surface of the metal recess portion may be spaced away from the solder contact surface of the metal projection portion. For example, the contact pad may take the form of any of the contact pads 150 discussed herein. In some embodiments, the contact pad formed at 4304 may take the form of any of the contact pads 4000, 4100, or 4200.

Various processes may be used to form the contact pad at 4304. For example, one or more iterations of a photolithography process may be used.

FIGS. 44-50 illustrate various operations in the formation of the contact pad 150F (FIGS. 19-21), in accordance with some embodiments of a first process. The first process illustrated by FIGS. 44-50 may be used to form the contact pad at 4304 (FIG. 43). The use of the contact pad 150F in FIGS. 44-50 is simply illustrative, and any suitable ones of the contact pads disclosed herein may be formed in accordance with the operations illustrated with reference to FIGS. 44-50.

Figure 44:
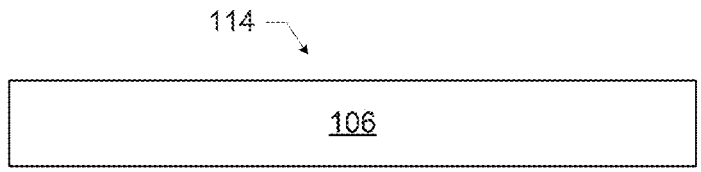
FIGS. 44-50 illustrate various operations in a first process for forming a contact pad, in accordance with various embodiments.

FIG. 44 illustrates a surface 114 of a substrate 106, prior to deposition of any lithographic or plated material. A seed layer may be present on the surface 114.

Figure 45:
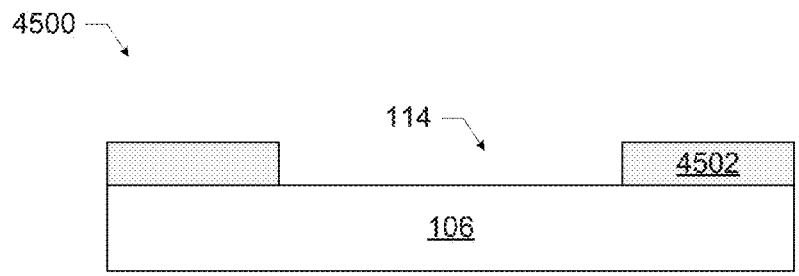

FIG. 45 illustrates an assembly 4500 subsequent to the application of a first lithographic pattern 4502 to the surface 114 of the substrate 106 of FIG. 44. The first lithographic pattern 4502 may correspond to the metal recess portion 154 of the contact pad 150F under formation.

Figure 46:
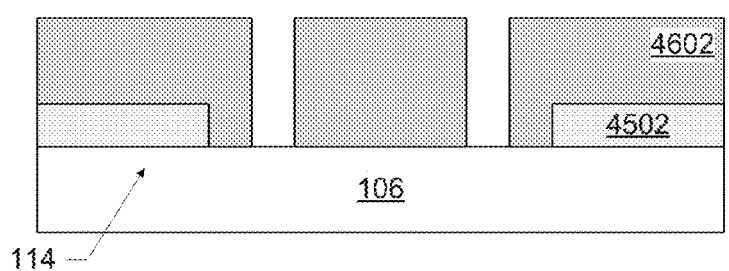

FIG. 46 illustrates an assembly 4600 subsequent to the application of a second lithographic pattern 4602 to the assembly 4500 (FIG. 45). The second lithographic pattern 4602 may correspond to the metal projection portion 152 of the contact pad 150F under formation.

Figure 47:
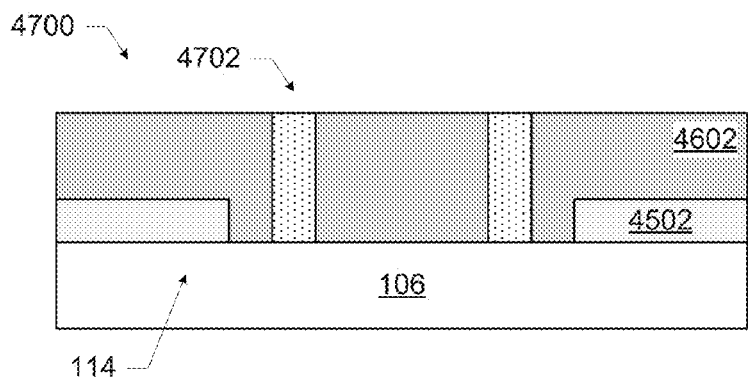

FIG. 47 illustrates an assembly 4700 subsequent to the plating of the surface 114 of the assembly 4600 (FIG. 46) to deposit a material 4702. As used herein, "plating" may include the deposition of a metal or other conductive material, such as copper.

Figure 48:
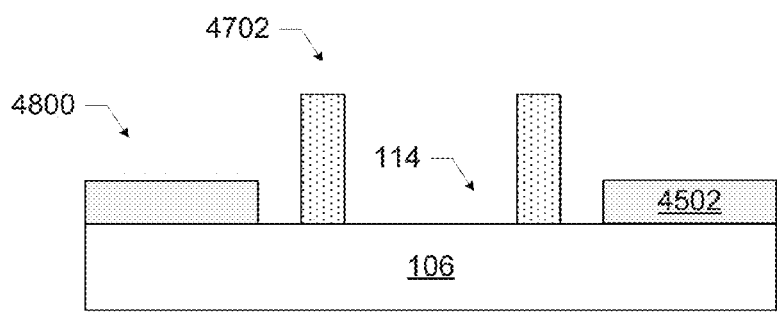

FIG. 48 illustrates an assembly 4800 subsequent to the removal of the second lithographic pattern 4602 (FIG. 46) from the assembly 4700 (FIG. 47).

Figure 49:
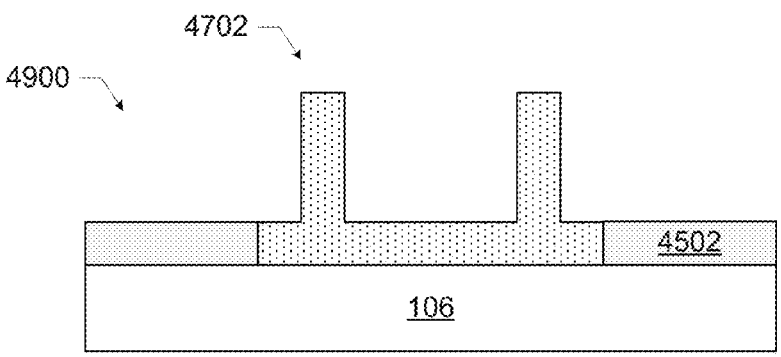

FIG. 49 illustrates an assembly 4900 subsequent to the plating of the surface 114 of the assembly 4800 (FIG. 48) to deposit more of the material 4702.

Figure 50:
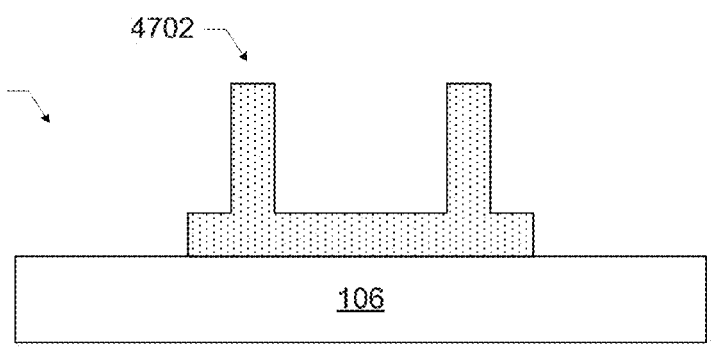

FIG. 50 illustrates an assembly 5000 subsequent to the removal of the first lithographic pattern 4502 (FIG. 45) from the assembly 4900 (FIG. 49). The material 4702 of the assembly 5000 may have the form of the contact pad 150F.

FIGS. 51-57 illustrate various operations in the formation of the contact pad 150F (FIGS. 19-21), in accordance with some embodiments of a second process. The second process illustrated by FIGS. 51-57 may be used to form the contact pad at 4304 (FIG. 43). The use of the contact pad 150F in FIGS. 51-57 is simply illustrative, and any suitable ones of the contact pads disclosed herein may be formed in accordance with the operations illustrated with reference to FIGS. 51-57.

Figure 51:
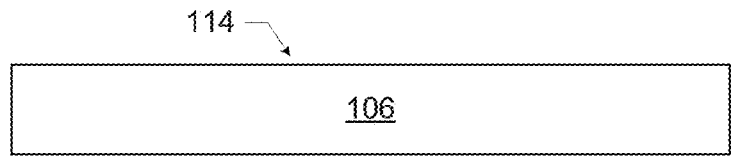
FIGS. 51-57 illustrate various operations in a second process for forming a contact pad, in accordance with various embodiments.

FIG. 51 illustrates a surface 114 of the substrate 106, prior to deposition of any lithographic or plated material. A seed layer may be present on the surface 114.

Figure 52:
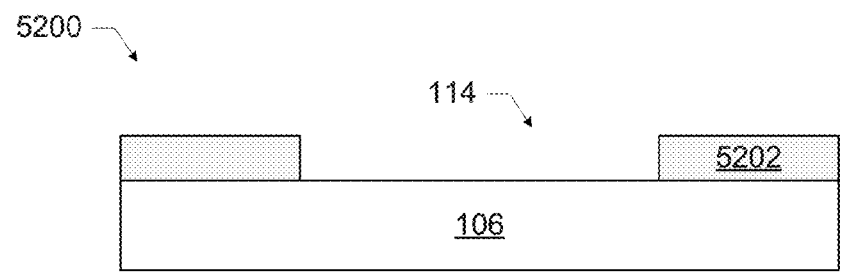

FIG. 52 illustrates an assembly 5200 subsequent to application of a first lithographic pattern 5202 to the surface 114 of the substrate 106 of FIG. 51. The first lithographic pattern 5202 may correspond to the metal recess portion 154 of the contact pad 150F under formation.

Figure 53:
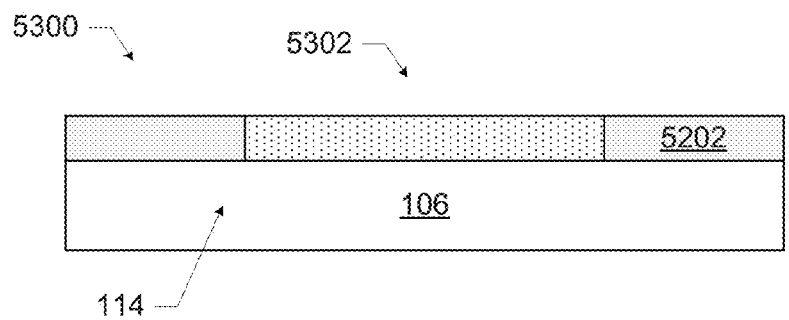

FIG. 53 illustrates an assembly 5300 subsequent to the plating of the surface 114 of the assembly 5200 (FIG. 52) to deposit a material 5302.

Figure 54:
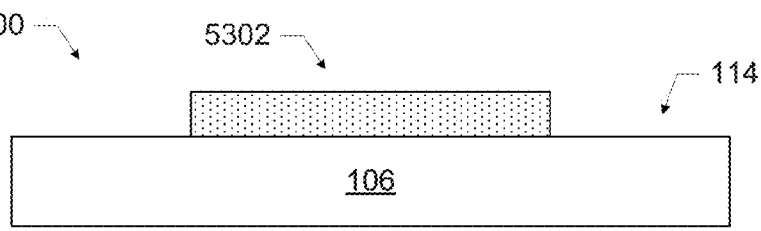

FIG. 54 illustrates an assembly 5400 subsequent to the removal of the first lithographic pattern 5202 (FIG. 52) from the assembly 5300 (FIG. 53).

Figure 55:
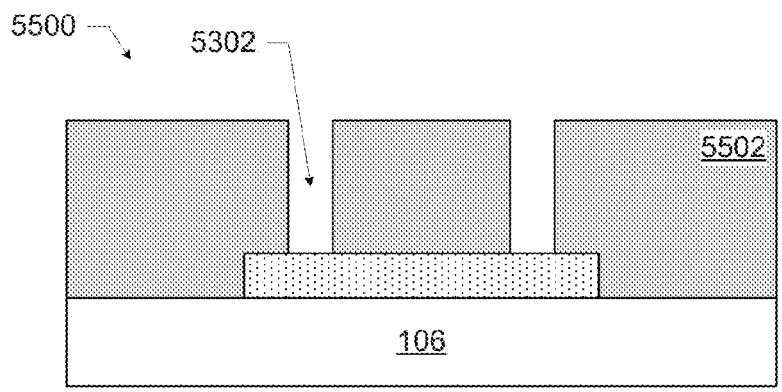

FIG. 55 illustrates an assembly 5500 subsequent to application of a second lithographic pattern 5502 to the assembly 5400 (FIG. 54). The second lithographic pattern 5402 may correspond to the metal projection portion 152 of the contact pad 150F under formation.

Figure 56:
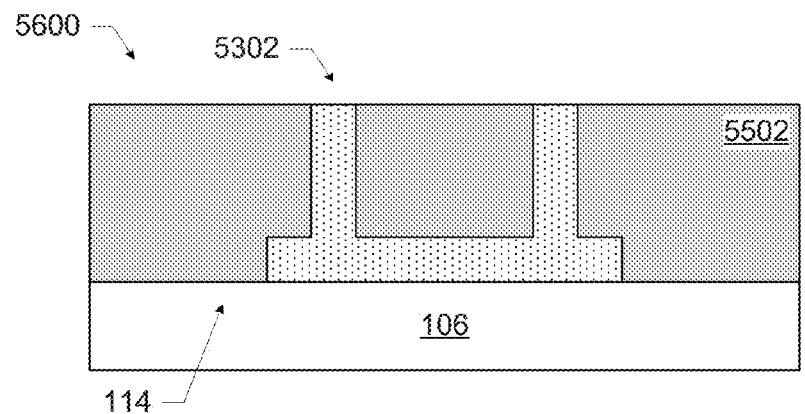

FIG. 56 illustrates an assembly 5600 subsequent to the plating of the surface 114 of the assembly 5500 (FIG. 55) to deposit more of the material 5302.

Figure 57:
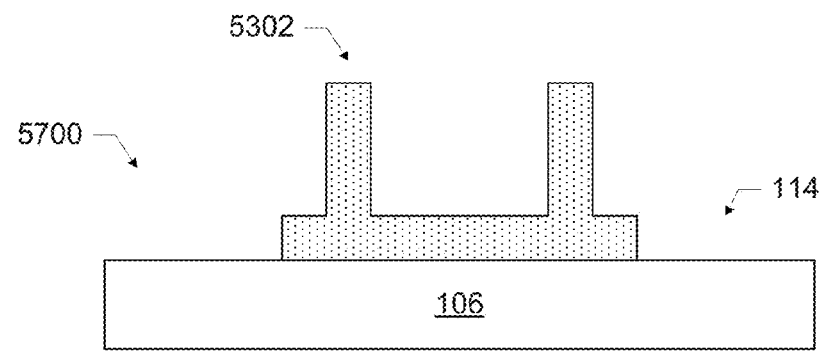

FIG. 57 illustrates an assembly 5700 subsequent to the removal of the second lithographic pattern 5502 (FIG. 55) from the assembly 5600 (FIG. 56). The material 5302 of the assembly 5700 may have the form of the contact pad 150F.

Figure 58:
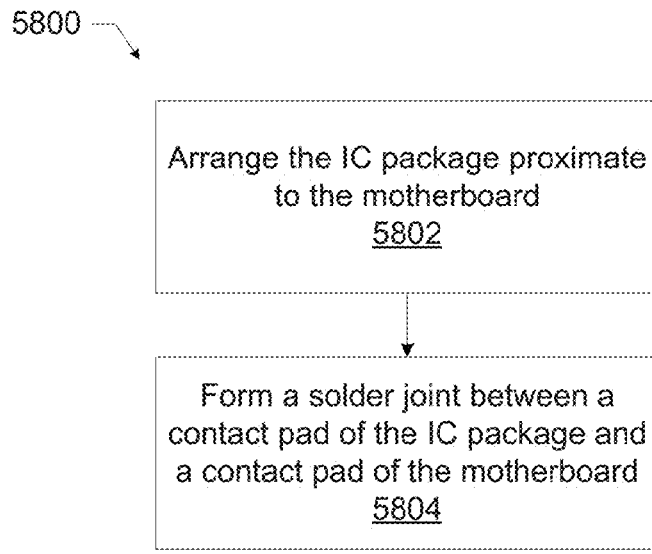
FIG. 58 is a flow diagram of a process for coupling an IC package to a circuit board, in accordance with various embodiments.

FIG. 58 is a flow diagram of a process 5800 for coupling an IC package to a circuit board, in accordance with various embodiments. Although operations of the process 5800 may be discussed with reference to the IC package 102, the circuit board 104, and components thereof, this is simply for illustrative purposes and the process 5800 may be utilized to couple any suitable IC package to any suitable circuit board. Additionally, the process 5800 may be used to couple any suitable IC package to any other IC package or desired device.

At 5802, an IC package may be arranged proximate to a circuit board. For example, the IC package 102 may be arranged proximate to the circuit board 106.

At 5804, a solder joint may be formed between a contact pad of the IC package and a contact pad of the circuit board. In some embodiments, the contact pad of the IC package of 5804 may have a metal projection portion and a metal recess portion, the metal projection portion and the metal recess portion may each have a solder contact surface, and a solder contact surface of the metal recess portion may be spaced away from the solder contact surface of the metal projection portion. For example, the contact pad of the IC package of 5804 may include any of the contact pads 150 disclosed herein. In some embodiments, the contact pad of the IC package of 5804 may include the contact pad 4000, the contact pad 4100, or the contact pad 4200 disclosed herein.

Any desired process may be used to form the solder joint at 5804. For example, in some embodiments, a solder ball may be placed in contact with the contact pad of the IC package and the contact pad of the circuit board and re-flowed in accordance with known techniques. Services of the contact pads may be fluxed before solder is applied.

Figure 59:
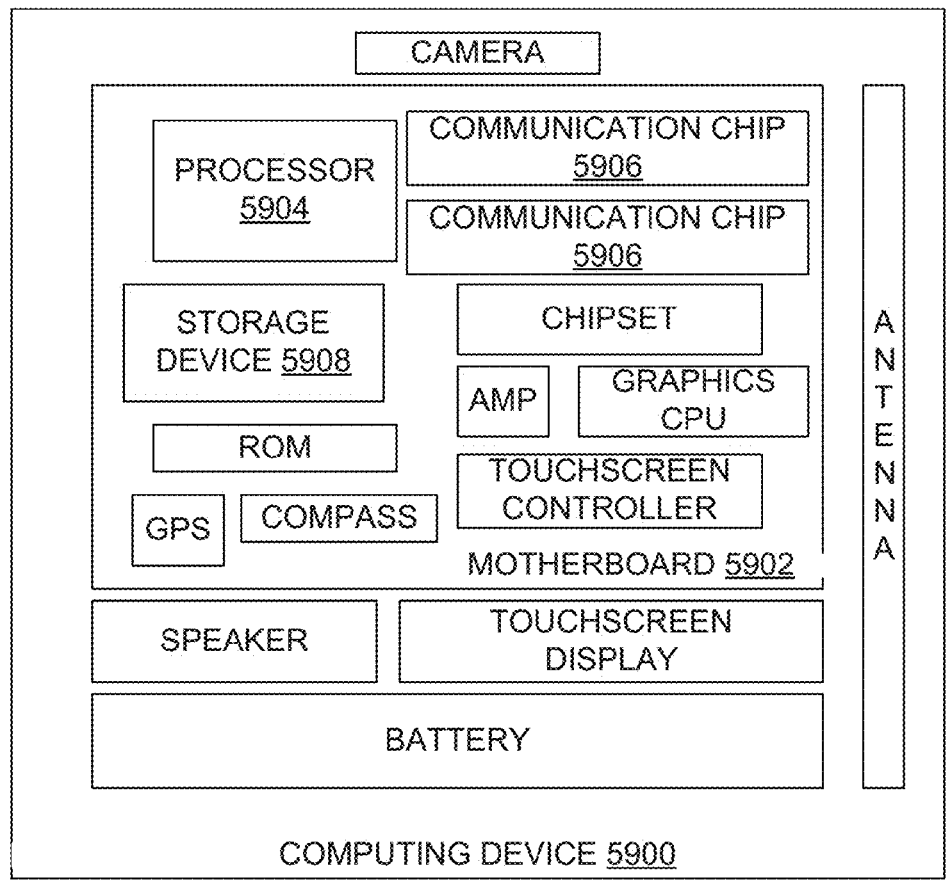
FIG. 59 is a block diagram of an example computing device that may include one or more of any of the contact pads disclosed herein.

Embodiments of the present disclosure may be implemented into a system using any IC packages that may benefit from the contact pads and manufacturing techniques disclosed herein. In particular, the contact pads disclosed herein may be used with any suitable IC package connected by solder balls to a circuit board (e.g., a motherboard or other IC packages). FIG. 59 schematically illustrates a computing device 5900, in accordance with some implementations, which may include IC packages having contact pads formed in accordance with one or more of the contact pads disclosed herein (e.g., any of the contact pads 150, 4000, 4100, or 4200). In particular, in some embodiments, embodiments of IC packages including the contact pads disclosed herein (e.g., the IC package 102) may be included in the computing device 5900, or a portion of the computing device 5900. For example, the IC package 102 may be configured as a storage device 5908 of the computing device 5900 (discussed below).

The computing device 5900 may be, for example, a mobile communication device or a desktop or rack-based computing device. The computing device 5900 may house a board such as motherboard 5902. The motherboard 5902 may include a number of components, including (but not limited to) a processor 5904 and at least one communication chip 5906. Any of the components discussed herein with reference to the computing device 5900 may be arranged in an IC package including any of the contact pads disclosed herein. The processor 5904 may be physically and electrically coupled to the motherboard 5902 (e.g., using any of the contact pads disclosed herein). In some implementations, the at least one communication chip 5906 may also be physically and electrically coupled to the motherboard 5902 (e.g., using any of the contact pads disclosed herein). In further implementations, the communication chip 5906 may be part of the processor 5904.

The computing device 5900 may include a storage device 5908. In some embodiments, the storage device 5908 may include one or more solid state drives. Examples of storage devices that may be included in the storage device 5908 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 5900 may include other components that may or may not be physically and electrically coupled to the motherboard 5902. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera. In various embodiments, any one or more of these components may include contact pads in accordance with any of the contact pads disclosed herein.

The communication chip 5906 and the antenna may enable wireless communications for the transfer of data to and from the computing device 5900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 5906 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide area (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 5906 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 5906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 5906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 5906 may operate in accordance with other wireless protocols in other embodiments.

The computing device 5900 may include a plurality of communication chips 5906. For instance, a first communication chip 5906 may be dedicated to shorter range wireless communications such as Wi-Fi and Bluetooth, and a second communication chip 5906 may be dedicated to longer range wireless communications such as GPS, EDGE, GPRS, CDMA, WiMAX, LTE, EV-DO, and others. In some embodiments, the communication chip 5906 may support wired communications. For example, the computing device 5900 may include one or more wired servers.

The processor 5904 and/or the communication chip 5906 of the computing device 5900 may include one or more dies or other components in an IC package. Such an IC package may be coupled with a circuit board (such as the mother board 5902) via any of the contact pads disclosed herein. The term "processor" may refer to any device or portion of a device that processes electronic data from registers and/or memory to transform that electronic data into other electronic data that may be stored in registers and/or memory.

In various implementations, the computing device 5900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 5900 may be any other electronic device that processes data. In some embodiments, the contact pads disclosed herein may be implemented in a high-performance computing device.

The following paragraphs provide examples of the embodiments disclosed herein. Example 1 is a contact pad on a substrate of an IC package, the contact pad including: a metal projection portion having a solder contact surface; and a metal recess portion having a solder contact surface, wherein the solder contact surface of the metal recess portion is spaced away from the solder contact surface of the metal projection portion and is disposed closer to the substrate.

Example 2 may include the subject matter of Example 1, and may further specify that a footprint of the metal recess portion is substantially annular.

Example 3 may include the subject matter of any of Examples 1-2, and may further specify that a footprint of the metal recess portion includes a substantially circular portion.

Example 4 may include the subject matter of any of Examples 1-3, and may further specify that the metal projection portion comprises a plurality of pillars.

Example 5 may include the subject matter of Example 4, and may further specify that the plurality of pillars are arranged substantially in a ring formation.

Example 6 may include the subject matter of any of Examples 4-5, and may further specify that at least one pillar has a substantially rectangular footprint.

Example 7 may include the subject matter of any of Examples 1-6, and may further specify that a footprint of the metal projection portion is substantially annular.

Example 8 may include the subject matter of Example 7, and may further specify that a height difference between the solder contact surface of the metal recess portion and the solder contact surface of the metal projection portion is between approximately 15 microns and 30 microns.

Example 9 may include the subject matter of any of Examples 1-8, and may further specify that the contact pad has a substantially circular footprint having an outer perimeter and a center, and wherein the metal projection portion is disposed closer to the outer perimeter than to the center.

Example 10 is an IC package, including: a substrate having a first surface and a second surface disposed opposite to the first surface; a die disposed on the first surface of the substrate; and a contact pad disposed on the second surface of the substrate, the contact pad including a metal projection portion and a metal recess portion, wherein a solder contact surface of the metal recess portion is spaced away from a solder contact surface of the metal projection portion and is disposed closer to the substrate.

Example 11 may include the subject matter of Example 10, and may further specify that the contact pad is a first contact pad, and that's the IC package further includes a second contact pad disposed on the second surface of the substrate, wherein the second contact pad has a uniform solder contact surface.

Example 12 may include the subject matter of Example 11, and may further specify that the die is disposed closer to the first contact pad than the second contact pad.

Example 13 may include the subject matter of any of Examples 10-12, and may further specify that the IC package is coupled to a circuit board via a solder joint between the contact pad and a contact pad on the circuit board.

Example 14 may include the subject matter of Example 13, and may further specify that the metal recess portion comprises a channel in which solder of the solder joint is disposed.

Example 15 may include the subject matter of any of Example 13-14, and may further specify that at least some of the metal projection portion extends into solder of the solder joint.

Example 16 may include the subject matter of any of Examples 10-15, and may further specify that a footprint of the contact pad has an outer perimeter, and the outer perimeter has a wave pattern.

Example 17 is a method of manufacturing an IC package, including: coupling a die to a first surface of a substrate, the substrate having a second surface opposite to the first surface; and forming a contact pad on the second surface of the substrate, wherein the contact pad comprises a metal projection portion having a solder contact surface and a metal recess portion having a solder contact surface, and wherein the solder contact surface of the metal recess portion is spaced away from the solder contact surface of the metal projection portion.

Example 18 may include the subject matter of Example 17, and may further specify that forming the contact pad includes: applying a first lithographic pattern to the second surface of the substrate, the first lithographic pattern corresponding to the metal recess portion; after applying the first lithographic pattern, applying a second lithographic pattern to the second surface of the substrate, the second lithographic pattern corresponding to the metal projection portion; after applying the second lithographic pattern, plating the second surface of the substrate; after plating the second surface of the substrate in accordance with the second lithographic pattern, removing the second lithographic pattern; after removing the second lithographic pattern, plating the second surface of the substrate; and after plating the second surface of the substrate in accordance with the first lithographic pattern, removing the first lithographic pattern.

Example 19 may include the subject matter of Example 17, and may further specify that forming the contact pad includes: applying a first lithographic pattern to the second surface of the substrate, the first lithographic pattern corresponding to the metal recess portion; after applying the first lithographic pattern, plating the second surface of the substrate; after plating the second surface of the substrate in accordance with the first lithographic pattern, removing the first lithographic pattern; after removing the first lithographic pattern, applying a second lithographic pattern to the second surface of the substrate, the second lithographic pattern corresponding to the metal projection portion; after applying the second lithographic pattern, plating the second surface of the substrate; and after plating the second surface of the substrate in accordance with the second lithographic pattern, removing the second lithographic pattern.

Example 20 may include the subject matter of any of Example 17-19, and may further specify that the contact pad is a first contact pad, and that the method further includes forming a second contact pad on the second surface of the substrate, the second contact pad having a uniform solder contact surface.

Example 21 may include the subject matter of Example 20, and may further specify that the die is disposed closer to the first contact pad than the second contact pad.

Example 22 is a method of coupling an IC package to a circuit board, including: arranging the IC package proximate to the circuit board; and forming a solder joint between a contact pad of the IC package and a contact pad on the circuit board, wherein the contact pad comprises a metal projection portion having a solder contact surface and a metal recess portion having a solder contact surface, wherein the solder contact surface of the metal recess portion is spaced away from the solder contact surface of the metal projection portion.

Example 23 may include the subject matter of Example 22, and may further specify that the contact pad is a first contact pad, and that the method further includes forming a solder joint between a second contact pad of the IC package and a second contact pad on the circuit board, wherein the second contact pad of the IC package has a uniform solder contact surface.

Example 24 may include the subject matter of Example 23, and may further specify that the IC package comprises a die, and the die is disposed closer to the first contact pad than the second contact pad.

Example 25 may include the subject matter of any of Examples 1-24, and may further specify that the metal projection portion comprises a single pillar.

What is claimed is:

1. A contact pad on a substrate of an integrated circuit (IC) package, the contact pad comprising: a metal projection portion having a solder contact surface; and a metal recess portion having a solder contact surface, wherein the solder contact surface of the metal recess portion is spaced away from the solder contact surface of the metal projection portion and is disposed closer to the substrate, and wherein a footprint of the metal recess portion includes a wave pattern shape of the integrated circuit.

2. The contact pad of claim 1, wherein a footprint of the metal recess portion includes a substantially circular portion.

3. The contact pad of claim 1, wherein the metal projection portion comprises a plurality of pillars.

4. The contact pad of claim 1, wherein a footprint of the metal projection portion is substantially annular.

5. The contact pad of claim 1, wherein the contact pad has a substantially circular footprint having an outer perimeter and a center, and wherein the metal projection portion is disposed closer to the outer perimeter than to the center.

6. The contact pad of claim 1, wherein the metal projection portion comprises a single pillar.

7. The contact pad of claim 3, wherein the plurality of pillars are arranged substantially in a ring formation.

8. The contact pad of claim 3, wherein at least one pillar has a substantially rectangular footprint.

9. The contact pad of claim 4, wherein a height difference between the solder contact surface of the metal recess portion and the solder contact surface of the metal projection portion is between approximately 15 microns and 30 microns.

10. An integrated circuit (IC) package, comprising:
a substrate having a first surface and a second surface disposed opposite to the first surface;
a die disposed on the first surface of the substrate; and
a contact pad disposed on the second surface of the substrate, the contact pad including a metal projection portion and a metal recess portion with an outer perimeter with a wave pattern shape, wherein a solder contact surface of the metal recess portion is spaced away from a solder contact surface of the metal projection portion and is disposed closer to the substrate of the integrated circuit.

11. The IC package of claim 10, wherein the contact pad is a first contact pad, and wherein the IC package further comprises:
a second contact pad disposed on the second surface of the substrate, wherein the second contact pad has a uniform solder contact surface.

12. The IC package of claim 10, wherein the IC package is coupled to a circuit board via a solder joint between the contact pad and a contact pad on the circuit board.

13. The IC package of claim 11, wherein the die is disposed closer to the first contact pad than the second contact pad.

14. The IC package of claim 12, wherein the metal recess portion comprises a channel in which solder of the solder joint is disposed.

15. The IC package of claim 12, wherein at least some of the metal projection portion extends into solder of the solder joint.

16. A method of manufacturing an integrated circuit (IC) package, comprising: coupling a die to a first surface of a substrate, the substrate having a second surface opposite to the first surface; and forming a contact pad on the second surface of the substrate, wherein: the contact pad comprises a metal projection portion having a solder contact surface and a metal recess portion having a solder contact surface; and the solder contact surface of the metal recess portion is spaced away from the solder contact surface of the metal projection portion and has a footprint with an outer perimeter with a wave pattern shape of the integrated circuit.

17. The method of claim 16, wherein forming the contact pad comprises:
applying a first lithographic pattern to the second surface of the substrate, the first lithographic pattern corresponding to the metal recess portion; after applying the first lithographic pattern, applying a second lithographic pattern to the second surface of the substrate, the second lithographic pattern corresponding to the metal projection portion; after applying the second lithographic pattern, plating the second surface of the substrate;
after plating the second surface of the substrate in accordance with the second lithographic pattern, removing the second lithographic pattern;
after removing the second lithographic pattern, plating the second surface of the substrate; and
after plating the second surface of the substrate in accordance with the first lithographic pattern, removing the first lithographic pattern.

18. The method of claim 16, wherein forming the contact pad comprises:
applying a first lithographic pattern to the second surface of the substrate, the first lithographic pattern corresponding to the metal recess portion;
after applying the first lithographic pattern, plating the second surface of the substrate;
after plating the second surface of the substrate in accordance with the first lithographic pattern, removing the first lithographic pattern;
after removing the first lithographic pattern, applying a second lithographic pattern to the second surface of the substrate, the second lithographic pattern corresponding to the metal projection portion;
after applying the second lithographic pattern, plating the second surface of the substrate; and
after plating the second surface of the substrate in accordance with the second lithographic pattern, removing the second lithographic pattern.

19. The method of claim 16, wherein the contact pad is a first contact pad, and wherein the method further comprises:
forming a second contact pad on the second surface of the substrate, the second contact pad having a uniform solder contact surface.

20. The method of claim 19, wherein the die is disposed closer to the first contact pad than the second contact pad.

21. A method of coupling an integrated circuit (IC) package to a circuit board, comprising: arranging the IC package proximate to the circuit board; and forming a solder joint between a contact pad of the IC package and a contact pad on the circuit board, wherein the contact pad comprises a metal projection portion having a solder contact surface and a metal recess portion having a solder contact surface and a footprint with an outer perimeter with a wave pattern shape, wherein the solder contact surface of the metal recess portion is spaced away from the solder contact surface of the metal projection portion of the integrated circuit.

22. The method of claim 21, wherein the contact pad is a first contact pad, and wherein the method further comprises:
forming a solder joint between a second contact pad of the IC package and a second contact pad on the circuit board, wherein the second contact pad of the IC package has a uniform solder contact surface.

23. The method of claim 22, wherein the IC package comprises a die, and the die is disposed closer to the first contact pad than the second contact pad.

* * * * *